United States Patent
Itoh et al.

(10) Patent No.: US 9,105,671 B2
(45) Date of Patent: Aug. 11, 2015

(54) LIQUID PROCESSING APPARATUS AND LIQUID PROCESSING METHOD

(71) Applicant: TOKYO ELECTRON LIMITED, Tokyo (JP)

(72) Inventors: Norihiro Itoh, Koshi (JP); Kazuhiro Aiura, Koshi (JP)

(73) Assignee: Tokyo Electron Limited, Minato-Ku (JP)

( * ) Notice: Subject to any disclaimer, the term of this patent is extended or adjusted under 35 U.S.C. 154(b) by 0 days.

(21) Appl. No.: 14/241,574

(22) PCT Filed: Oct. 23, 2012

(86) PCT No.: PCT/JP2012/077317
§ 371 (c)(1),
(2) Date: Feb. 27, 2014

(87) PCT Pub. No.: WO2013/061950
PCT Pub. Date: May 2, 2013

(65) Prior Publication Data
US 2014/0352726 A1 Dec. 4, 2014

(30) Foreign Application Priority Data
Oct. 24, 2011 (JP) .................................. 2011-232862

(51) Int. Cl.
*H01L 21/67* (2006.01)
*H01L 21/02* (2006.01)
(Continued)

(52) U.S. Cl.
CPC ............ *H01L 21/67051* (2013.01); *B05B 3/18* (2013.01); *B05B 15/1203* (2013.01);
(Continued)

(58) Field of Classification Search
None
See application file for complete search history.

(56) References Cited

U.S. PATENT DOCUMENTS

2007/0289527 A1* 12/2007 Ito ................................... 118/52
2008/0142051 A1* 6/2008 Hashizume .................... 134/23
(Continued)

FOREIGN PATENT DOCUMENTS

JP 07-326555 A1 12/1995
JP 2007-035866 A 2/2007
(Continued)

OTHER PUBLICATIONS

International Preliminary Report on Patentability (Application No. PCT/JP2012/077317) dated Apr. 29, 2014 (with English translation).
(Continued)

*Primary Examiner* — Nicole Blan
(74) *Attorney, Agent, or Firm* — Burr & Brown, PLLC

(57) ABSTRACT

A liquid processing apparatus includes a substrate retaining part that retains a substrate in a horizontal position and rotates the substrate, first and second processing liquid supply nozzles disposed to supply first and second processing liquids, respectively, to the substrate, liquid receiving cups disposed to appropriately position an upper end thereof above the substrate and to receive the first or second processing liquid that has been supplied to the substrate, a first tubular outer cup including an upper opening and disposed around the liquid receiving cup, vertically movable between a lifted position to which the first tubular outer cup is lifted so that its upper end is positioned above the liquid receiving cup, and a lowered position lower than the lifted position, and a second tubular outer cup disposed externally to the first tubular outer cup. The tubular outer cup is selected according to the kind of processing liquid.

14 Claims, 12 Drawing Sheets

(51) Int. Cl.
| | |
|---|---|
| B08B 3/04 | (2006.01) |
| B05D 1/02 | (2006.01) |
| B05C 9/06 | (2006.01) |
| B05C 11/10 | (2006.01) |
| B05B 3/18 | (2006.01) |
| B05B 15/12 | (2006.01) |
| B61H 5/00 | (2006.01) |
| F16D 66/02 | (2006.01) |
| G01B 11/30 | (2006.01) |
| G01B 21/20 | (2006.01) |
| B60B 17/00 | (2006.01) |
| F16D 65/12 | (2006.01) |
| F16D 65/02 | (2006.01) |

(52) U.S. Cl.
CPC .............. *B05C 9/06* (2013.01); *B05C 11/1039* (2013.01); *B05C 11/1044* (2013.01); *B05D 1/02* (2013.01); *B08B 3/04* (2013.01); *B60B 17/00* (2013.01); *B60B 17/0068* (2013.01); *B61H 5/00* (2013.01); *F16D 65/12* (2013.01); *F16D 66/02* (2013.01); *G01B 11/306* (2013.01); *G01B 21/20* (2013.01); *H01L 21/02057* (2013.01); *B60B 2900/325* (2013.01); *F16D 2065/138* (2013.01); *F16D 2065/1392* (2013.01)

(56) References Cited

U.S. PATENT DOCUMENTS

| | | | |
|---|---|---|---|
| 2009/0114253 A1* | 5/2009 | Matsumoto | 134/30 |
| 2009/0293914 A1* | 12/2009 | Aratake et al. | 134/18 |

FOREIGN PATENT DOCUMENTS

| | | |
|---|---|---|
| JP | 2008-153521 A1 | 7/2008 |
| JP | 2008-235302 A1 | 10/2008 |
| JP | 2009-218404 A1 | 9/2009 |
| JP | 2012-142392 A1 | 7/2012 |
| JP | 2012-178544 A1 | 9/2012 |

OTHER PUBLICATIONS

International Search Report (Application No. PCT/JP2012/077317) dated Jan. 22, 2013.

* cited by examiner

LIQUID PROCESSING APPARATUS AND LIQUID PROCESSING METHOD

TECHNICAL FIELD

The present invention relates to a liquid processing apparatus and a liquid processing method, used to conduct various kinds of liquid processes such as cleaning and etching upon substrates.

BACKGROUND ART

In semiconductor device fabrication processes, a resist film is formed on a process target film formed on a substrate such as a semiconductor wafer (hereinafter referred to simply as "wafer"), and a process such as etching, ion implantation, etc. is performed to the process target film using the resist film as a mask. After the process, the resist film that is no longer necessary is removed from the wafer.

The removal of the photoresist film commonly uses an SPM (Sulfuric Acid Hydrogen Peroxide Mixture) process. The SPM process is performed by supplying to the photoresist film an SPM liquid which is a solution obtained by mixing sulfuric acid and a hydrogen peroxide solution.

In general, the SPM process is performed by supplying the SPM liquid from a chemical liquid supply nozzle to the spinning wafer retained in a horizontal position on a substrate retaining part. During the SPM process, since high-temperature SPM liquid is ejected toward the wafer, fumes comprising a vapor or a mist of reaction products of the SPM liquid and the resist are produced. Members surrounding the space near the wafer are provided to prevent the fumes from spreading and from contaminating the interior of a processing chamber. For example, in the apparatus described in Japanese Patent Application Publication No. JP2007-035866A, the edge of a wafer is surrounded by a splashguard (hereinafter, also referred to as "cup") for receiving the process liquid, and a shielding plate (hereinafter, also referred to as "top plate") is placed above the wafer upper surface (i.e., process target surface), whereby dispersing of the fumes is prevented.

However, a gap must be provided between an upper portion of the cup and the top plate to allow the passage of a nozzle support member for supporting the chemical liquid supply nozzle. Accordingly, fumes leak through this gap. A need may also arise for the SPM process to be followed by another chemical liquid cleaning process that uses the same apparatus. In this case, since the SPM liquid and fumes are highly contaminative, it is desirable to avoid cross contamination.

SUMMARY OF THE INVENTION

The present invention provides a technique that enables provision of a liquid processing apparatus that can prevent or suppress the leakage of an atmosphere around the substrate derived from a processing liquid in each liquid process, and can also prevent cross contamination, when different kinds of liquid processes are performed by using one apparatus.

The present invention provides a liquid processing apparatus which includes: a substrate retaining part that retains a substrate in a horizontal position and rotates the substrate; a first processing liquid supply nozzle that supplies a first processing liquid to the substrate retained by the substrate retaining part; a second processing liquid supply nozzle that supplies a second processing liquid to the substrate retained by the substrate retaining part; a liquid receiving cup disposed to surround the substrate retained by the substrate retaining part in radial directions of the substrate such that an upper end of the liquid receiving cup is positioned above the substrate, so as to receive the processing liquid having been supplied from the first processing liquid supply nozzle or the second processing liquid supply nozzle to the substrate; a first tubular outer cup including an upper opening and disposed around the liquid receiving cup, the first tubular outer cup being vertically movable between a lifted position at which an upper end of the first tubular outer cup is positioned above the liquid receiving cup, and a lowered position positioned lower than the lifted position; and a second tubular outer cup including an upper opening and disposed around the liquid receiving cup and outside the first tubular outer cup, the second tubular outer cup being vertically movable between a lifted position at which an upper end of the second tubular outer cup is positioned above the liquid receiving cup, and a lowered position positioned lower than the lifted position.

The present invention also provides a liquid processing method that uses a liquid processing apparatus which includes: a substrate retaining part that retains a substrate in a horizontal position and rotates the substrate; a first processing liquid supply nozzle that supplies a first processing liquid to the substrate retained by the substrate retaining part; a second processing liquid supply nozzle that supplies a second processing liquid to the substrate retained by the substrate retaining part; a liquid receiving cup disposed to surround the substrate retained by the substrate retaining part in radial directions of the substrate such that an upper end of the liquid receiving cup is positioned above the substrate, so as to receive the processing liquid having been supplied from the first processing liquid supply nozzle or the second processing liquid supply nozzle to the substrate; a first tubular outer cup including an upper opening and disposed around the liquid receiving cup, the first tubular outer cup being vertically movable between a lifted position at which an upper end of the first tubular outer cup is positioned above the liquid receiving cup, and a lowered position positioned lower than the lifted position; and a second tubular outer cup including an upper opening and disposed around the liquid receiving cup and outside the first tubular outer cup, the second tubular outer cup being vertically movable between a lifted position at which an upper end of the second tubular outer cup is positioned above the liquid receiving cup, and a lowered position positioned lower than the lifted position, the liquid processing method including: a first liquid processing step of processing the substrate with the first processing liquid by supplying the first processing liquid from the first nozzle to the substrate while rotating the substrate retained by the substrate retaining part with the first tubular outer cup located at its lifted position and the second tubular outer cup located at its lowered position; and a second liquid processing step of processing the substrate with the second processing liquid by supplying the second processing liquid from the second nozzle to the substrate while rotating the substrate retained by the substrate retaining part with the second tubular outer cup located at its lifted position and the first tubular outer cup located at its lowered position.

According to the present invention, the first tubular outer cup and the second tubular outer cup prevent an atmosphere derived from the processing liquid in a space above the substrate, from spreading outward in a radial direction of the substrate during each of liquid processing with the first processing liquid and liquid processing with the second processing liquid. In addition, cross contamination can be prevented by using the first tubular outer cup and the second tubular outer cup exclusively during liquid processing with the first processing liquid and liquid processing with the second processing liquid, respectively.

EMBODIMENTS FOR CARRYING OUT THE INVENTION

Hereunder, an embodiment of the present invention will be described with reference to the accompanying drawings.

Figure 1:
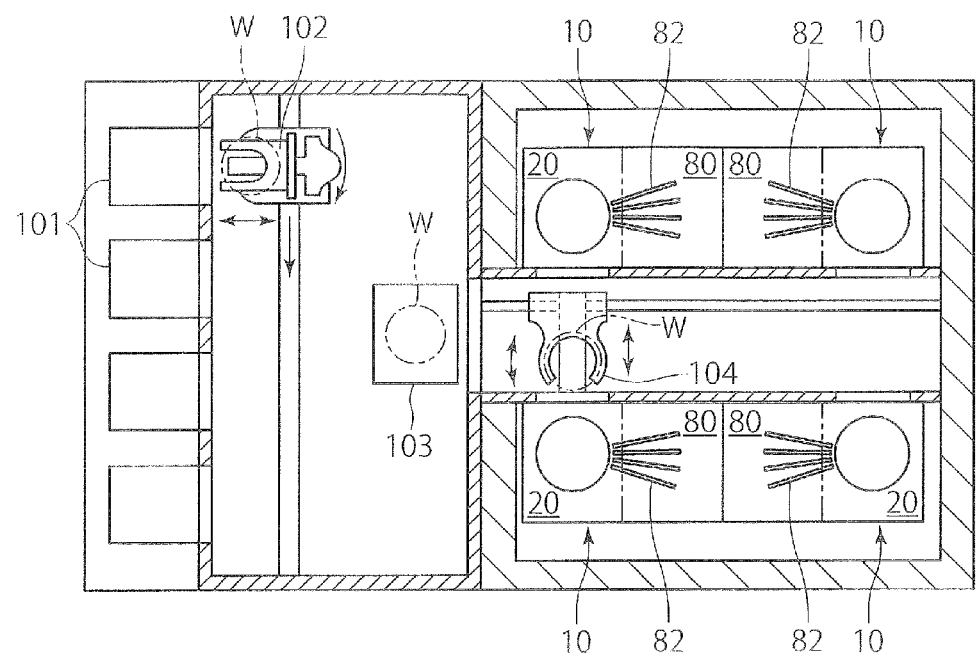
FIG. 1 is a top view of a liquid processing system that includes liquid processing apparatuses according to an embodiment.

First, a liquid processing system that includes a liquid processing apparatus 10 according to an embodiment is described below with reference to FIG. 1. As shown in FIG. 1, the liquid processing system includes: resting tables 101 each for placing thereon an independent carrier which contains substrates, e.g., semiconductor wafers (hereinafter also referred to simply as "wafer(s) W") that have been carried in from the outside of the system; a transport arm 102 for removing the wafers W from the carrier; a transfer unit 103 for placing thereon the wafers W that the transport arm 102 has removed from the carrier; and a transport arm 104 for receiving each wafer W from the transfer unit 103 and then carrying the wafer W into the liquid processing apparatus 10. As shown in FIG. 1, a plurality of (in the illustrated embodiment, four) liquid processing apparatuses 10 are provided in the liquid processing system.

Next, a schematic configuration of one liquid processing apparatus 10 is described below with reference to FIGS. 2 to 4.

Figure 2:
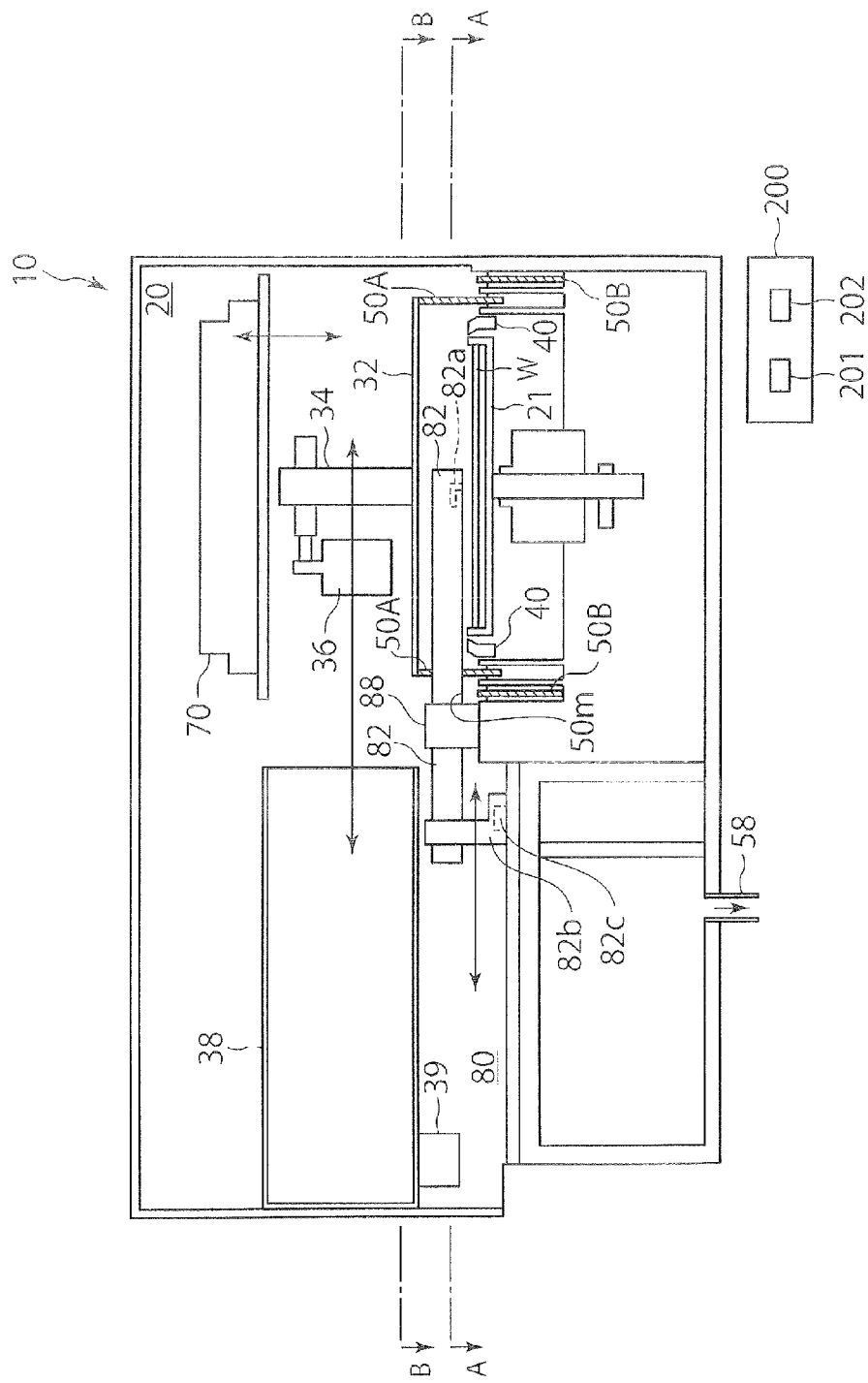
FIG. 2 is a side view showing schematically an overall configuration of one of the liquid processing apparatuses shown in FIG. 1.
Figure 3:
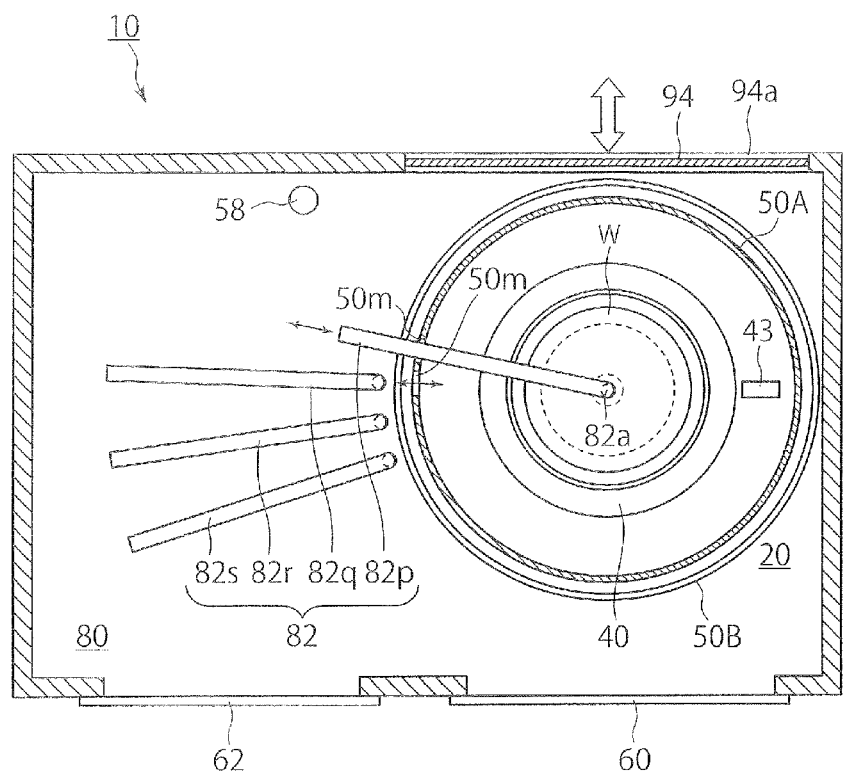
FIG. 3 is a top view taken along arrow-marked section A-A of the liquid processing apparatus shown in FIG. 2.
Figure 4:
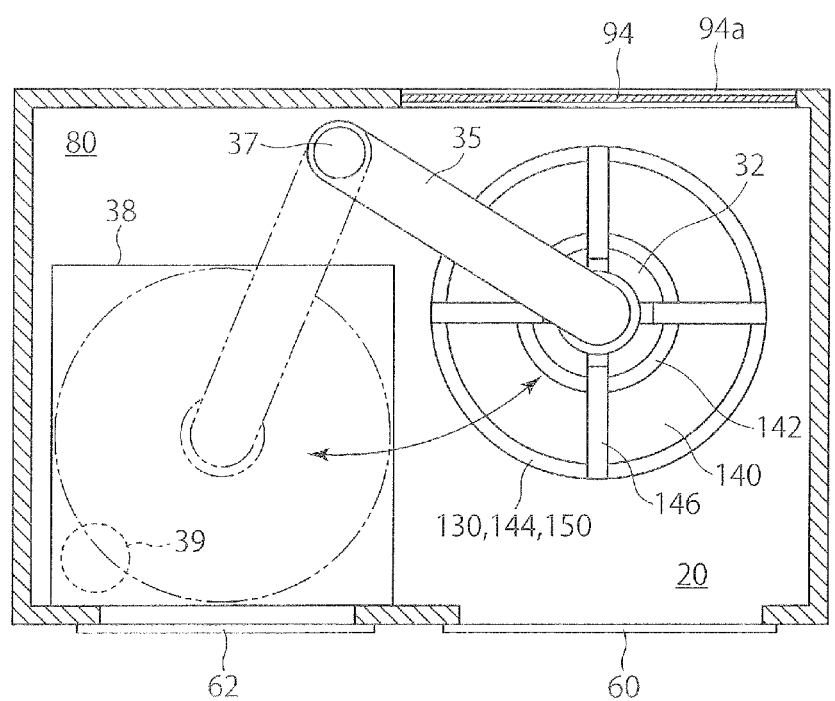
FIG. 4 is a top view taken along arrow-marked section B-B of the liquid processing apparatus shown in FIG. 2.

As shown in FIGS. 2 to 4, the liquid processing apparatus 10 includes a process chamber 20 in which a liquid process is performed to a wafer W contained therein, and a standby region 80 formed adjacently to the process chamber 20. In the liquid processing apparatus 10 according to the present embodiment, the process chamber 20 and the standby region 80 communicate with each other. As shown in FIG. 2, a substrate retaining part 21 that retains the wafer W in a horizontal position and rotates the wafer W is provided in the process chamber 20. A ring-shaped rotary cup 40 is disposed around the substrate retaining part 21. The rotary cup 40 is provided to receive a processing liquid that will be splashed from the rotating wafer W by centrifugal force when a liquid process of the wafer W is being performed. In addition, as shown in FIGS. 2 and 3, tubular outer cups are doubly arranged around the rotary cups 40 in the process chamber 20 such that the cylindrical outer cup 50A formed in a circular cylindrical shape and the tubular outer cup 50B disposed outside the cylindrical outer cup 50A are arranged concentrically. The tubular outer cups 50A, 50B can be independently moved upward or downward, depending on the kind of processing preformed to the wafer W. Further detailed configurations of the substrate retaining part 21, the rotary cup 40, and the tubular outer cups 50A, 50B, will be described later.

As shown in FIG. 3, one liquid processing apparatus 10 further includes a plurality of (in the illustrated embodiment, four) nozzle support arms 82 (82p, 82q, 82r, 82s), with one nozzle 82a (or two nozzles 82a, 82a' (See also FIG. 8)) being provided at the distal end of each nozzle support arm 82. As a whole, each nozzle support arm has an elongated bar shape, more specifically an elongated circular cylindrical shape. Only one of the plurality of nozzle support arms 82 is shown in FIG. 2. As shown in FIG. 2, each nozzle support arm 82 has an arm support 82b (not shown in FIG. 3), and the arm support 82b is actuated linearly in a longitudinal direction of the nozzle support arm 82, that is, in leftward/rightward directions in FIG. 2, by a linear driving mechanism 82c (not shown in FIG. 3) shown schematically with a dashed line. The linear driving mechanism 82c may have any structure, but may be constructed, for example, such that the arm support 82b is provided to slide along a guide rail (not shown), the arm support 82b is fixed to a belt (not shown) that is mounted over pulleys (not shown) provided at both ends of the guide rail, and the arm support 82b is moved by driving the belt. The nozzle support arm 82 moves linearly in a horizontal direction between an advance position at which the distal end of the nozzle support arm 82 is moved into an internal space of the cylindrical outer cup 50A or 50B through a side opening 50m formed in a side portion of the relevant cylindrical outer cup (50A or 50B), and a retreat position at which the distal end of the nozzle support arm 82 is retreated from the internal space of the tubular outer cup 50A or 50B (See arrows shown near the nozzle support arm 82 in FIGS. 2 and 3).

As shown in FIGS. 2 and 4, a top plate 32 for covering from above the wafer W retained by the substrate retaining part 21 is provided so as to be movable in a horizontal direction. The top plate 32 can move between an advance position as denoted by solid lines in FIG. 4 in which the top plate 32 covers from above the wafer W retained by the substrate retaining part 21, and a retreat position as denoted by double-dashed lines in FIG. 4 in which the top plate 32 is retreated from the advanced position in a horizontal direction. The top plate 32 and its peripheral components will be described in further detail later.

As shown in FIG. 2, an air hood 70 for covering from above the wafer W retained by the substrate retaining part 21, is provided so as to be movable up and down. A clean gas such as nitrogen gas ($N_2$ gas) or clean air flows downward from the air hood 70. The air hood 70 is provided so as to be vertically movable between a lowered position for covering from above the wafer W retained by the substrate retaining part 21, and a lifted position higher than the lowered position. FIG. 2 shows a state in which the air hood 70 is positioned at the lifted position. The air hood 70 covers the wafer from above, even when at the lifted position. Constituent elements of the air hood 70 will be described later.

As shown in FIGS. 2 and 3, provided in a bottom portion of the standby region 80 is an exhaust portion 58, which exhausts an internal atmosphere of the standby region 80. Particles originating from the linear driving mechanism 82c for driving each nozzle support arm 82 will be suctioned into the exhaust portion 58 for removal.

As shown in FIGS. 3 and 4, in the housing of the liquid processing apparatus 10, shutters 60 and 62 are provided at openings provided in the process chamber 20 area and the standby region 80, respectively. Internal devices of the process chamber 20 and those of the standby region 80 can be accessed for maintenance upon opening the shutters 60 and 62. The shutters 60 and 62 are both provided at a side opposite to an opening 94a (described later), which is provided to allow the transport arm 104 to carry the wafer W out from and into the process chamber 20.

As shown in FIG. 3, provided in a sidewall of the housing of the liquid processing apparatus 10 is the opening 94a, which allows the transport arm 104 to carry the wafer W into and out from the process chamber 20. A shutter 94 for opening and closing the opening 94a is provided at this opening 94a.

Next, the constituent elements of the liquid processing apparatus 10 that are shown in FIGS. 2 to 4 are described in detail below with reference to FIGS. 5 to 8.

Figure 5:
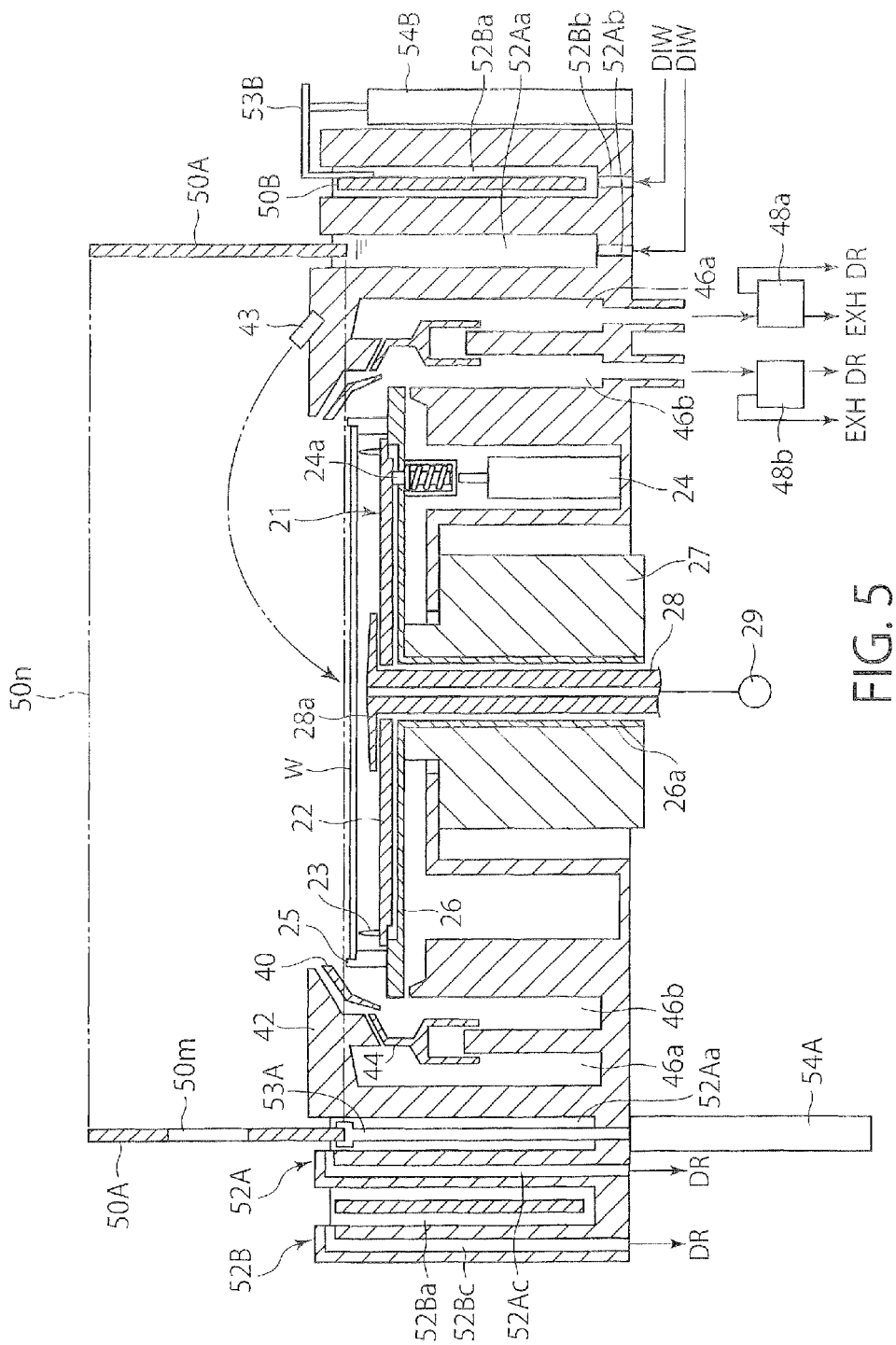
FIG. 5 is a vertical cross-sectional view that shows a substrate retaining part and constituent elements of its periphery in the liquid processing apparatus shown in FIG. 2.

The substrate retaining part 21 is first described with reference to FIG. 5. FIG. 5 is a vertical cross-sectional view that shows the substrate retaining part 21 and its peripheral constituent elements among the constituent elements of the liquid processing apparatus 10.

As shown in FIG. 5, the substrate retaining part 21 includes a disk-shaped retaining plate 26 for retaining the wafer W, and a disk-shaped lift pin plate 22 disposed above the retaining plate 26. Three lift pins 23 for supporting the wafer W from below are arranged at equal intervals in a circumferential direction on an upper surface of the lift pin plate 22. Only two of the three lift pins 23 are shown in FIG. 5. Below the lift pin plate 22, a piston mechanism 24 is provided, which moves the lift pin plate 22 vertically. When the transport arm 104 (see FIG. 1) places the wafer W on the lift pins 23 and when the transport arm takes away the wafer W placed on the lift pins 23, the piston mechanism 24 pushes a pin 24a upward, which in turn causes the lift pin plate 22 to move upward from the position shown in FIG. 5, so that the lift pin plate 22 occupies a position higher than that of the rotary cup 40. When a liquid process or a drying process is performed to the wafer W inside the process chamber 20, the piston mechanism 24 moves the lift pin plate 22 to the lowered position shown in FIG. 5, so that the rotary cup 40 becomes positioned around the wafer W.

Three retaining members 25 for retaining the wafer W from lateral directions of the wafer are arranged at equal intervals in a circumferential direction on the retaining plate 26. Only two of the three retaining members 25 are shown in FIG. 5. The retaining members 25 are constructed so that when the lift pin plate 22 moves from the lifted position to the lowered position shown in FIG. 5, the retaining members 25 hold the wafer W placed on the lift pins 23, from lateral directions of the wafer, and slightly lift the retained wafer W to slightly remove it from the lift pins 23.

In addition, through-holes are formed in the central portions of the lift pin plate 22 and the retaining plate 26, respectively. A processing liquid supply pipe 28 is disposed to pass through the through-holes. The processing liquid supply pipe 28 supplies a variety of processing liquids such as chemical liquids and deionized water to a lower surface of the wafer W retained by the retaining members 25 of the retaining plate 26. The processing liquid supply pipe 28 moves vertically, interlocked with the lift pin plate 22. A head portion 28a for blocking the through-hole in the lift pin plate 22 is formed at an upper end of the processing liquid supply pipe 28. Additionally, as shown in FIG. 5, a processing liquid supply unit 29 is connected to the processing liquid supply pipe 28, and the various processing liquids are supplied from the processing liquid supply unit 29 to the processing liquid supply pipe 28.

A ring-shaped rotary cup 40 is attached to the retaining plate 26 via joints not shown, and thus the rotary cup 40 rotates integrally with the retaining plate 26. As shown in FIG. 5, the rotary cup 40 is disposed to surround the wafer W retained by the retaining members 25 of the retaining plate 26, from lateral directions of the wafer W. During the liquid process of the wafer W, the rotary cup 40 thus can receive a processing liquid scattered laterally from the wafer W. The retaining plate 26 rotates by rotating a rotating shaft 26a extending downward from the retaining plate 26 by a rotational driving motor 27. At this time, the lift pin plate 22 placed at its lowered position is in engagement with the retaining plate 26 via the pin 24a, so that the retaining plate 26 rotates together with the lift pin plate 22.

A drain cup 42 and a guide cup 44 are disposed around the rotary cup 40. The drain cup 42 and the guide cup 44 are both formed into a ring form. The drain cup 42 and the guide cup 44 each have an opening at respective upper portions. The drain cup 42 is fixed in the process chamber 20 such that the upper end of the drain cup 42 is located higher than that of the substrate retained by the retaining members 25 in the process chamber 20. The guide cup 44 is movably provided inside the drain cup 42, and is moved vertically by a lifting cylinder not shown.

As shown in FIG. 5, a first draining portion 46a and a second draining portion 46b are disposed below the drain cup 42 and the guide cup 44, respectively. Depending on the vertical position of the guide cup 44 that is set depending on the type of the processing liquid used, the processing liquid scattered laterally from the wafer W is sent selectively to either of the two draining portions 46a and 46b. More specifically, the liquid process is performed using SC-1 liquid described later, the guide cup 44 occupies its lifted position (the position shown in FIG. 5) and the SC-1 liquid scattered laterally from the wafer W is sent to the second draining portion 46b. When the liquid process is performed using SPM liquid described later, the guide cup 44 occupies its lowered position and the SPM liquid scattered laterally from the wafer W is sent to the first draining portion 46a. As shown in FIG. 5, a gas-liquid separator 48a and a gas-liquid separator 48b are connected to the first draining portion 46a and the second draining portion 46b, respectively. The first draining portion 46a and the second draining portion 46b performs not only liquid draining but also gas discharging. As shown in FIG. 5, in the vapor-liquid separators 48a and 48b, a gas-liquid fluid mixture comprising waste processing liquids (also containing a mist thereof) and gases discharged from the first and second draining portions 46a and 46b are separated into liquids and gases, which are drained (DR) and exhausted (EXH), respectively.

As shown in FIG. 5, a fixed rinsing nozzle 43 that supplies deionized water toward a central portion of the wafer W is disposed on the drain cup 42. A rinsing liquid such as the deionized water is ejected in a parabolic form from the fixed rinsing nozzle 43 toward the central portion of the wafer W (see double-dashed lines in FIG. 5).

The aforementioned tubular outer cups 50A and 50B are disposed around the drain cup 42 and the guide cup 44. As shown in FIG. 5, a support member 53A that supports the inside tubular outer cup 50A is coupled to a lower end of the tubular outer cup 50A, and the support member 53A is moved vertically by a driving mechanism 54A. The driving mechanism 54A and the support member 53A can each be constructed from, for example, a cylinder section and rod section, respectively, of an air cylinder mechanism. The vertical movement of the support member 53A by the driving mechanism 54A enables the tubular outer cup 50A to move vertically between a lifted position at which the upper end of the tubular outer cup 50A is positioned above the upper end of the drain cup 42, and a lowered position that is lower than the lifted position. As shown in FIGS. 3 and 5, two side openings 50m are formed in side portions of the tubular outer cup 50A to allow the nozzle support arms 82p and 82q to pass therethrough. As shown in FIG. 5, the upper end of the tubular outer cup 50A is an open end, in other words, an upper opening 50n is formed at an upper portion of the tubular outer cup 50A. The tubular outer cup 50A is lifted until the upper opening 50n is blocked by the top plate 32.

A support member 53B for supporting the outside tubular outer cup 50B is coupled to the upper portion of the cup 50B, and a driving mechanism 54B for moving the support member 53B vertically is coupled to the support member 53B. The driving mechanism 54B can be constructed from an air cylinder mechanism, for example. By vertically moving the support member 53B by the driving mechanism 54B, the tubular outer cup 50B, similar to the inside tubular outer cup 50A shown in FIG. 5, can be moved vertically between a lifted position at which the upper end of the tubular outer cup 50B positioned above the upper end of the drain cup 42, and a lowered position that is lower than the lifted position. Two side openings (having the same shape as that of the side openings 50m in the tubular outer cup 50A) are provided on side portions of the tubular outer cup 50B to allow the nozzle support arms 82r and 82s to pass therethrough, which are not shown. Similar to the tubular outer cup 50A, an upper opening is formed in an upper portion of the tubular outer cup 50B, and this upper opening is blocked by the air hood 70 when the tubular outer cup 50B is positioned at its lifted position and the air hood 70 is positioned at its lowered position.

In addition, as shown in FIG. 5, cleaning parts 52A and 52B for cleaning the tubular outer cups 50A and 50B, respectively, are provided inside the process chamber 20. The cleaning parts 52A and 52B include ring-shaped cleaning tanks 52Aa and 52Ba, respectively, for storing a cleaning liquid such as deionized water (DIW). When the tubular outer cups 50A and 50B are positioned at their respective lowered positions, the tubular outer cups 50A and 50B are immersed in the cleaning liquid stored within the cleaning tanks 52Aa and 52Ba, whereby the tubular outer cups 50A and 50B can be cleaned. As shown in the left section of FIG. 5, a suitable seal (not shown) that prevents leakage of the cleaning liquid while permitting the vertical movement of the support member 53A is disposed between a bottom wall of the cleaning tank 52Aa and the support member 53A extending through the bottom wall. When the inside tubular outer cup 50A is positioned at its lowered position, the tubular outer cup 50A is preferably immersed in its entirety (down to the upper end) in the cleaning liquid stored within the cleaning tank 52Aa.

Cleaning liquid supply paths 52Ab, 52Bb are formed at bottom portions (see the right side of FIG. 5) of the cleaning tanks 52Aa, 52Ba, and as shown schematically with arrows in FIG. 5, the cleaning liquid is continuously supplied from a cleaning liquid supply source (DIW) to the cleaning liquid supply paths 52Ab, 52Bb. Liquid draining paths 52Ac and 52Bc are open at upper side-portions (see the left side of FIG. 5) of the cleaning tanks 52Aa and 52Ba, and the cleaning liquid in the cleaning tanks 52Aa, 52Ba is drained via the liquid draining paths 52Ac, 52Bc. That is, flows of the cleaning liquid that are directed upward from the cleaning liquid supply paths 52Ab, 52Bb at the bottom portions of the cleaning tanks 52Aa, 52Ba and then drained from the liquid draining paths 52Ac, 52Bc at the upper portions of the cleaning tanks 52Aa, 52Ba are formed inside the cleaning tanks 52Aa, 52Ba. The cleaning liquid adhering to the tubular outer cups 50A, 50B is washed away from the tubular outer cups 50A, 50B by those flows, so that the cleaning liquid within the cleaning tanks 52Aa, 52Ba are always kept clean. In fact, the cleaning liquid supply paths 52Ab, 52Bb and the liquid draining paths 52Ac, 52Bc are each provided in plurality at intervals in a circumferential direction. In FIG. 5, however, one path only is shown for each in order to simplify the drawing.

As shown in FIG. 2, immediately outside the tubular outer cup 50B, one arm cleaning part 88 for each nozzle support arm 82 is provided to clean the nozzle support arm. While detailed illustration of a configuration of the arm cleaning parts 88 is omitted, the arm cleaning parts 88 each has a cleaning room (not shown) that contains a cleaning liquid in it, and the corresponding nozzle support arm 82 of an elongate circular cylindrical shape extends through the cleaning room. When the nozzle support arm 82 moves from the advance position to the retreat position or vice versa, the nozzle support arm 82 moves with a part of this arm in contact with the cleaning liquid in the cleaning room and is thus cleaned. Instead of the above, each arm cleaning part 88 may include a nozzle that injects a shower of the cleaning liquid into the cleaning room, or may include a gas nozzle that injects a gas to dry the cleaning liquid. In FIG. 3, the arm cleaning part 88 is omitted for the simplicity of the drawing.

Details of the fluids emitted from the nozzles 82a (82a') of the four nozzle support arms 82 (82p to 82s) are described below referring to FIG. 8.

Figure 8:
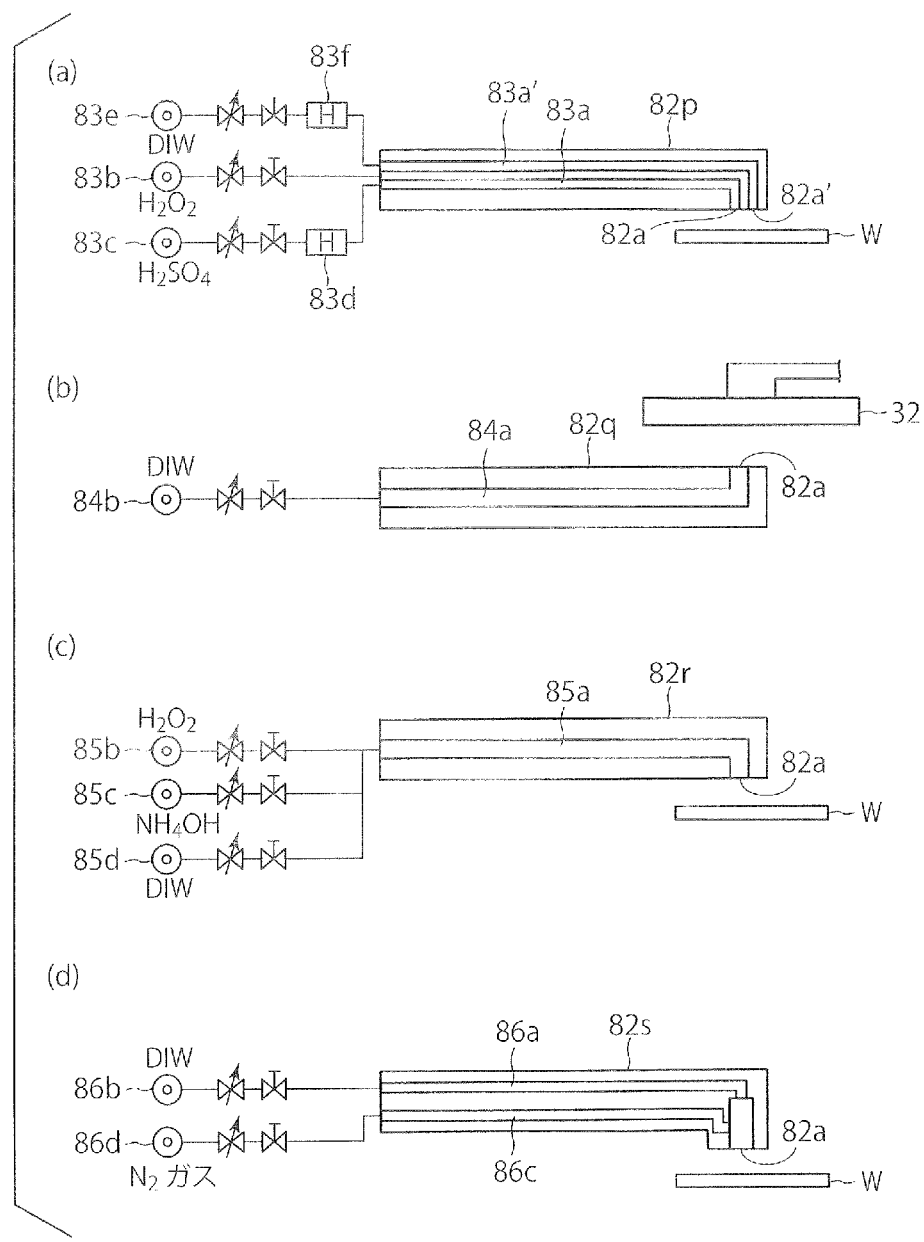
FIG. 8 is an explanatory diagram that shows configurations of nozzles and nozzle support arms in the liquid processing apparatus shown in FIG. 2.

As shown in (a) of FIG. 8, the two nozzles 82a, 82a' are provided on the first nozzle support arm 82p among the four nozzle support arms 82. The SPM liquid obtained by mixing sulfuric acid and a hydrogen peroxide solution is emitted downward from the nozzle 82a of the first nozzle support arm 82p, toward the wafer W. A processing liquid supply line 83a connected to the nozzle 82a is provided inside the first nozzle support arm 82p, and a hydrogen peroxide solution supply portion 83b and a sulfuric acid supply portion 83c, both provided in parallel to each other, are each connected to the processing liquid supply line 83a via a flow control valve and an opening/closing valve. A heater 83d for heating the sulfuric acid supplied from the sulfuric acid supply portion 83c is also provided. The hydrogen peroxide solution and sulfuric acid supplied from the hydrogen peroxide solution supply portion 83b and the sulfuric acid supply portion 83c, respectively, are mixed and the resulting SPM liquid is supplied to the nozzle 82a of the first nozzle support arm 82p via the processing liquid supply line 83a. The sulfuric acid supplied from the sulfuric acid supply portion 83c is heated by the heater 83d, and this heated sulfuric acid and the hydrogen peroxide solution are mixed to cause heat of reaction. Accordingly, the SPM liquid emitted from the nozzle 82a of the first nozzle support arm 82p is heated to a high temperature of at least 100° C., for example, nearly 170° C. Additionally, hot deionized water (DIW) heated as a rinsing liquid, is emitted downward from the nozzle 82a' of the first nozzle support arm

82p, toward the wafer W. A processing liquid supply line 83a' connected to the nozzle 82a' is provided inside the first nozzle support arm 82p, and a deionized water supply portion 83e is connected to the processing liquid supply line 83a' via a flow control valve and an opening/closing valve. A heater 83f is provided to heat the deionized water supplied from the deionized water supply portion 83e. The heater heats the deionized water to 60 to 80° C., for example.

A top-plate cleaning liquid for cleaning the top plate 32, such as deionized water, is emitted upward from the nozzle 82a of the second nozzle support arm 82q, as shown in (b) of FIG. 8. A cleaning liquid supply line 84a connected to the nozzle 82a is provided inside the second nozzle support arm 82q, and a cleaning liquid supply portion 84b is connected to the cleaning liquid supply line 84a via a flow control valve and an opening/closing valve. The top-plate cleaning liquid supplied from the cleaning liquid supply portion 84b, such as deionized water, is further sent to the nozzle 82a of the second nozzle support arm 82q via the cleaning liquid supply line 84a.

As shown in (c) of FIG. 8, the nozzle 82a of the third nozzle support arm 82r is adapted so that a mixture of aqueous ammonia and a hydrogen peroxide solution (hereinafter, this mixture is also referred to as the SC-1 liquid), and deionized water serving as a normal-temperature rinsing liquid can both be emitted downward in a direction toward the wafer W. A processing liquid supply line 85a connected to the nozzle 82a is provided inside the third nozzle support arm 82r, and a hydrogen peroxide solution supply portion 85b, an aqueous ammonia supply portion 85c, and a deionized water supply portion 85d, all provided in parallel to one another, are each connected to the processing liquid supply line 85a via a flow control valve and an opening/closing valve. When the SC-1 liquid is emitted from the nozzle 82a of the third nozzle support arm 82r, the opening/closing valve corresponding to the deionized water supply portion 85d is closed and the hydrogen peroxide solution and the aqueous ammonia are delivered from the hydrogen peroxide solution supply portion 85b and the aqueous ammonia supply portion 85c, respectively. The hydrogen peroxide solution and the aqueous ammonia are then mixed to generate the SC-1 liquid, which is then sent to the nozzle 82a of the third nozzle support arm 82r via the processing liquid supply line 85a. When the rinsing liquid comprising a deionized water of a normal temperature is supplied, the opening/closing valves corresponding to the hydrogen peroxide solution supply portion 85b and the aqueous ammonia supply portion 85c are closed and the deionized water is delivered from the deionized water supply portion 85d via the processing liquid supply line 85a.

As shown in (d) of FIG. 8, the nozzle 82a of the fourth nozzle support arm 82s is constructed as a two-fluid nozzle. A deionized water supply line 86a and an N2 gas supply line 86c are connected to the nozzle 82a of the fourth nozzle support arm 82s, with a deionized water supply portion 86b being further connected to the deionized water supply line 86a and an N2 gas supply portion 86d to the N2 gas supply line 86c. The deionized water supplied from the deionized water supply portion 86b via the deionized water supply line 86a, and the N2 gas supplied from the N2 gas supply portion 86d via the N2 gas supply line 86c are mixed inside the two-fluid nozzle, from which the deionized water droplets are then sprayed downward.

The second nozzle support arm 82q may be higher than the first nozzle support arm 82p in height level. This will prevent the second nozzle support arm 82q and the third nozzle support arm 82r from colliding or interfering with each other when both of the arms advance to the internal space of the tubular outer cup 50 at the same time. This will in turn enable the top plate 32 to be cleaned using the nozzle 82a of the second nozzle support arm 82q when a high temperature rinsing process is performed to the wafer W using the nozzle 82a of the first nozzle support arm 82p. The substrate retaining part 21, from which the wafer W has been removed, is also can be cleaned, when the top plate 32 is cleaned using the nozzle 82a of the second nozzle support arm 82q. Note that, in the foregoing case, the height level of the two side openings 50m formed in the inside tubular outer cup 50A is also changed.

When each nozzle support arm 82 is at the retreat position, the distal end of the nozzle support arm 82 becomes positioned close to the corresponding side opening 50m in the lifted tubular outer cup 50, and thus blocks the side opening 50m. This further prevents an atmosphere within the tubular outer cup 50 from leaking from the side opening 50m to the outside of the tubular outer cup 50.

Next, the detailed structure of the top plate 32 and its peripheral constituent elements will be described with reference to FIGS. 4, 6A, and 6B.

Figure 6A:
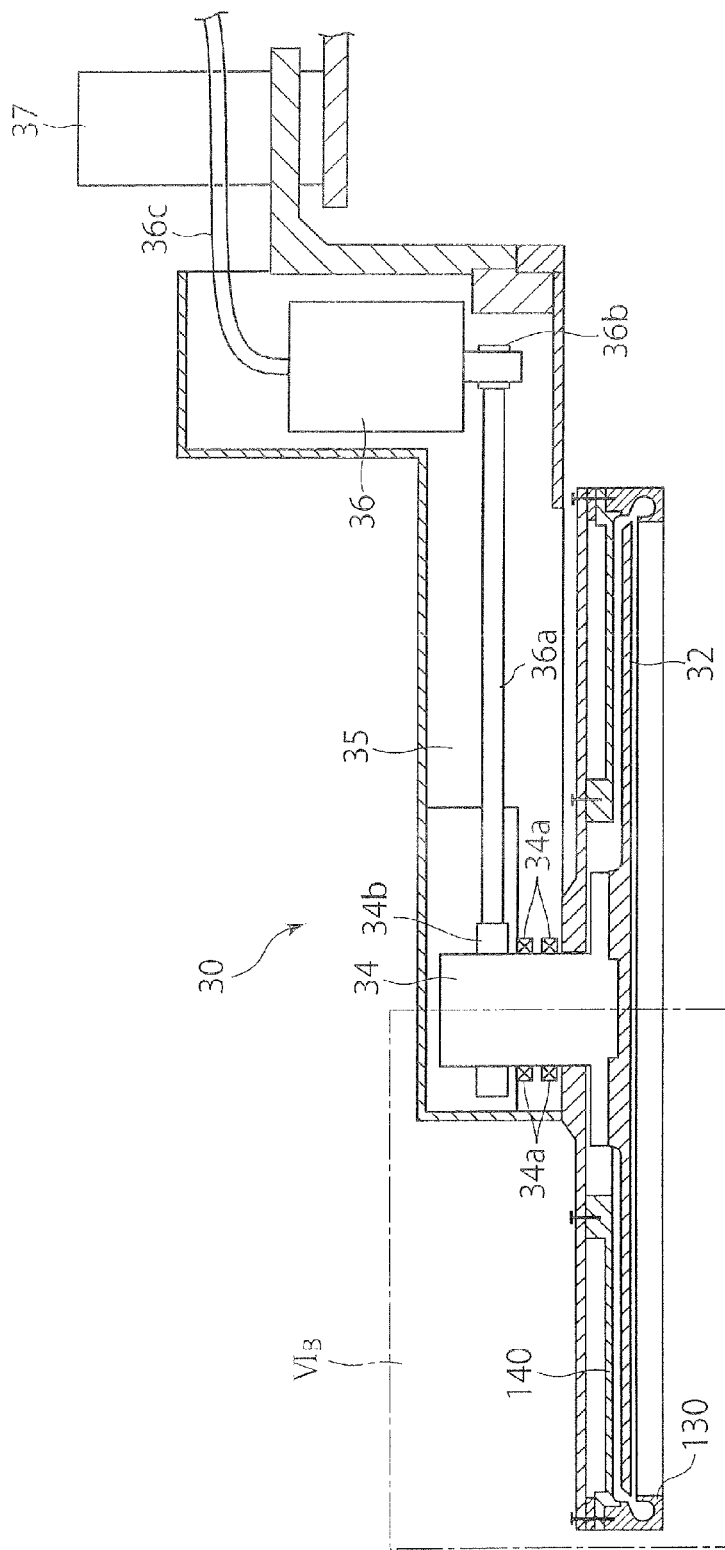
FIG. 6A is a vertical cross-sectional view that shows a top plate and constituent elements of its periphery in the liquid processing apparatus shown in FIG. 2.

The top plate 32 is retained by a top plate retaining arm 35 as shown in FIG. 6A. A rotating shaft 34 is mounted on an upper portion of the top plate 32, and bearings 34a are arranged between the rotating shaft 34 and the top plate retaining arm 35, so that the rotating shaft 34 can rotate with respect to the top plate retaining arm 35. The rotating shaft 34 is fitted with a pulley 34b. A servomotor 36 is provided at a proximal end of the top plate retaining arm 35, and a pulley 36b is also provided at a distal end of the servomotor 36. Stretched between the pulley 34b of the rotating shaft 34 and the pulley 36b of the servomotor 36 is an endless timing belt 36a, which transmits a rotational driving force of the servomotor 36 to the rotating shaft 34 to rotate the top plate 32 about the rotating shaft 34. A cable 36c is connected to the servomotor 36, and electric power is supplied from the outside of the housing of the liquid processing apparatus 10 through the cable 36c to the servomotor 36. The rotating shaft 34, the timing belt 36a, the servomotor 36, and so on constitute a top plate rotating mechanism that rotates the top plate 32 on a horizontal plane.

A ring-shaped liquid receiving member 130 is provided adjacently to an edge of the top plate 32 to receive a liquid (e.g., a condensate of fumes), which is scattered radially outward by centrifugal force after adhering to a lower surface of the top plate 32. The liquid receiving member 130 has therein a ring-shaped liquid receiving space 132, which opens toward the edge of the top plate 32. The liquid receiving member 130 includes an edge member 134 extending upward to define an inner circumferential end of the liquid receiving space 132. The edge of the top plate 32 is preferably positioned radially outside the edge member 134 to ensure that the liquid splashed from the top plate 32 will drop into the liquid receiving space 132.

One or more drain ports 136 connected to the liquid receiving space 132 are formed in the liquid receiving member 130. A draining line 137c on which a mist separator 137a and an ejector 137b are disposed is connected to the drain port 136, so that the interior of the liquid receiving space 132 can be suctioned as needed basis. The liquid within the liquid receiving space 132 can efficiently be discharged into the draining line 137c by suctioning the liquid receiving space 132. Additionally, by suctioning the liquid receiving space 132, an airstream directed to the inside of the oil receiving space 132 is generated near a lower surface of the edge of the top plate 32. The airstream pulls the liquid that reaches the edge of the top plate 32 into the liquid receiving space 132, so that the liquid can be reliably guided into the liquid receiving space 132. The liquid separated by the mist separator 137a is drained out to a factory waste liquid draining system (DR), and exhaust from the ejector 137b is released to a factory exhaust system (EXH). If only one drain port is provided, the drain port 136 is preferably provided below the top plate retaining arm 35 (see FIG. 4) to simplify the routing of the draining line 137c.

A non-rotatable circular rectifying plate 140 is provided above the rotatable top plate 32. A space 141 is defined between an upper surface of the top plate 32 and a lower surface of the rectifying plate 140. The peripheral portion of the lower surface of the rectifying plate 140 is connected to an inner upper surface 138 defining the liquid receiving space 132 of the liquid receiving member 130. When the liquid receiving space 132 is suctioned by the ejector 137b, an airstream flowing radially outward within the space 141 between the top plate 32 and the flow rectifying plate 140 is generated. This airstream flows into the liquid receiving space 132 through a gap between the edge of the top plate 32 and the inner upper surface 138 of the liquid receiving member 130. Accordingly, the liquid that flows into the liquid receiving space 132 through a gap between the edge of the top plate 32 and the edge member 134 of the liquid receiving member 130 is prevented from being spouted above the top plate 32 through the gap between the edge of the top plate 32 and the inner upper surface 138 of the liquid receiving member 130.

The liquid receiving member 130 and the flow rectifying plate 140 are supported by a plurality of (in this example, four) support arms 146 each fixed to the top plate retaining arm 35 and extending radially from the top plate retaining arm 35. At a lower surface of a distal end of each support arm 146, a mounting ring 150, an outer edge portion 144 of the flow rectifying plate 140, and the liquid receiving member 130 are stacked from above in that order and fastened to one another via a bolt 148a. The inner edge portion 142 of the flow rectifying plate 140 is fastened a proximal end portion of the support arm 146 via a bolt 148b. In the illustrated configuration example, therefore, the top plate 32, the liquid receiving member 130, and the flow rectifying plate 140 are supported by the top plate retaining arm 35 as a common support member to move together integrally. Only the top plate 32 can rotate about a vertical axis, and the liquid receiving member 130 and the flow rectifying plate 140 do not rotate.

Figure 6B:
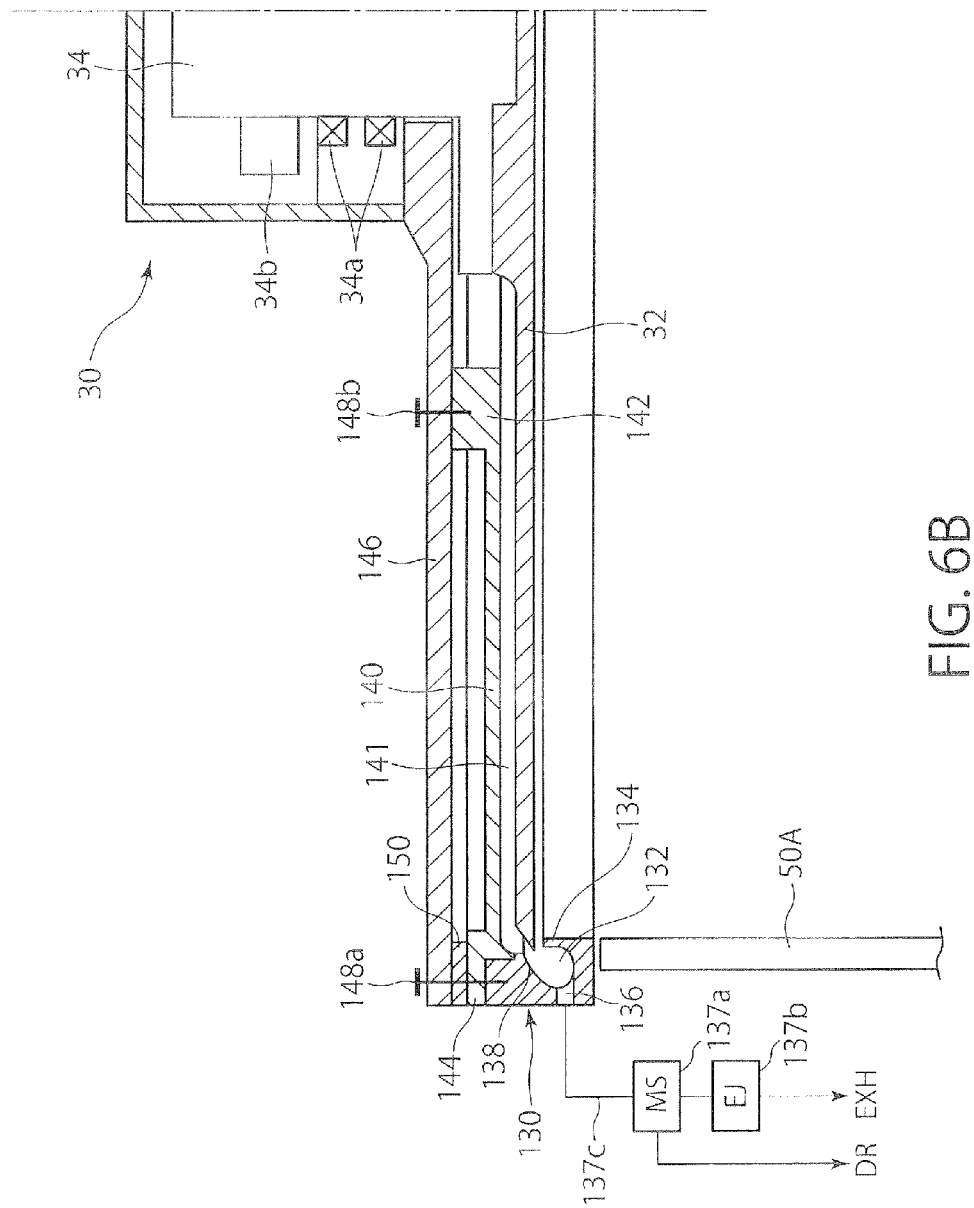
FIG. 6B is a vertical cross-sectional view showing a region $VI_B$ of FIG. 6A in enlarged form.

As shown in FIG. 6B, when the top plate 32 lies at its advance position and the inside tubular outer cup 50A lies at its lifted position, the lower surface of the liquid receiving member 130 comes into contact with the upper surface of the inside tubular outer cup 50A, or is brought into close proximity to the upper surface of the tubular outer cup 50A while defining such a slight gap therebetween that does not allow leakage therethrough. Thus the tubular outer cup 50A, the liquid receiving member 130, and the top plate 32 define an enclosed or closed space that surrounds the wafer W. At least one of the lower surface of the liquid receiving member 130 and the upper surface of the tubular outer cup 50 may be provided thereon with sealing member to seal the gap between the lower surface of the liquid receiving member 130 and the upper surface of the tubular outer cup 50.

As shown in FIGS. 4 and 6A, a rotating motor 37 is disposed at the proximal end of the top plate retaining arm 35, and the top plate retaining arm 35 turns around a rotating shaft of the rotating motor 37. This enables the top plate 32 to move between the advance position (shown with the solid lines in FIG. 4) at which it covers from above the wafer W retained by the substrate retaining part 21, and the retreat position (shown with the double-dashed lines in FIG. 4) at which the top plate 32 is retreated horizontally from the advance position.

In addition, as shown in FIGS. 2 and 4, a top plate storage section 38 is provided in the standby region 80 of the liquid processing apparatus 10 to house the top plate 32 when the top plate 32 is retreated to the retreat position. An opening is formed on a side portion of the top plate storage section 38, and when the top plate 32 is moved from the advance position to the retreat position, the top plate 32 is completely housed in the top plate storage section 38 via the opening on the side portion thereof. An exhaust portion 39 is disposed under the top plate storage section 38, and an internal atmosphere of the top plate storage section 38 is always suctioned by the exhaust portion 39. For this reason, even if droplets derived from the SPM liquid or any other kind of processing liquid adhere to the lower surface of the top plate 32 housed in the top plate storage section 38, an atmosphere derived from the droplets is not released to the standby region 80 or the inside of the process chamber 20.

Next, the detailed structure of the air hood 70 and its peripheral constituent elements is described below with reference to FIG. 7.

Figure 7:
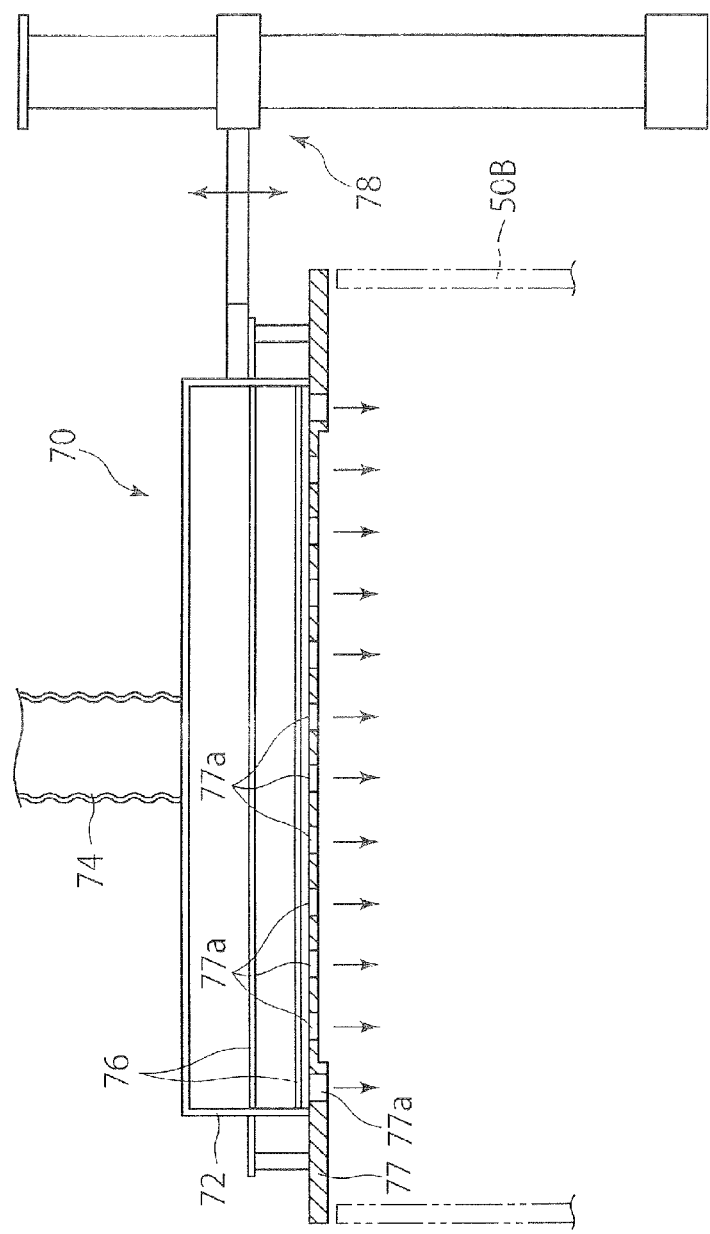
FIG. 7 is a vertical cross-sectional view that shows an air hood and constituent elements of its periphery in the liquid processing apparatus shown in FIG. 2.

As shown in FIG. 7, the air hood 70 includes: a casing 72 whose bottom portion is opened; and a bottom plate 77 having a plurality of openings 77a, such as a punching plate, provided under the casing 72. A single-layered or multilayered filter 76 is contained in the casing 72. A flexible duct 74 is connected to an upper portion of the casing 72, and the flexible duct 74 communicates with an external environment of the housing of the liquid processing apparatus 10. A fan (not shown) for feeding a gas into the casing 72 is disposed at a proximal end of the duct 74. The gas (e.g., air) is fed from the external environment of the housing of the liquid processing apparatus 10 via the duct 74 into the casing 72. After particles contained in the gas have been removed by the filter 76 in the casing 72, the resulting clean gas flows downward from the openings 77a in the bottom plate 77.

As shown in FIG. 7, an air hood lifting mechanism 78 is provided to move the air hood 70 vertically. The air hood lifting mechanism 78 enables the air hood 70 to move vertically between a lowered position at which the air hood 70 is brought close to and covers from above the wafer W retained by the substrate retaining part 21, and a lifted position that is even further apart from the wafer W upward than the lowered position. As previously described, FIG. 2 shows the state under which the air hood 70 is positioned at its lifted position. When the air hood 70 lies at its lowered position and the outside tubular outer cup 50B lies at its lifted position, the upper surface of the outside tubular outer cup 50B comes into contact with the lower surface of the bottom plate 77 of the air hood 70 or is brought into close proximity to the lower surface of the bottom plate 77 of the air hood 70 while defining such a slight gap therebetween that does not allow leakage therethrough. Thus as shown in FIG. 7, (i) to (j) of FIG. 10, and (k) of FIG. 11, an enclosed or closed space that surrounds the wafer W is defined around the wafer W by the air hood 70 and the tubular outer cup 50B. In the illustrated embodiment, the air hood 70 moves vertically between its lifted position and its lowered position and that the top plate 32 moves horizontally between its advance position and its retreat position, but the embodiments are not limited to the above. That is, the air hood 70 may move horizontally between its advance position and its retreat position and the top plate 32 may move vertically between its lifted position and its lowered position.

As shown in FIG. 2, the liquid processing apparatus 10 includes a controller 200 that conducts total operation control of the entire apparatus. The controller 200 controls operation of all functional parts of the liquid processing apparatus 10 (e.g., the substrate retaining part 21, the piston mechanism 24, the servomotor 36, the driving mechanisms 54A, 54B for the tubular outer cups 50A, 50B, the rotating motor 37 that moves the top plate 32, and the air hood lifting mechanism). The controller 200 can be realized by using, for example, a general-purpose computer as hardware, and programs as software for operating the computer (i.e., a device control program, processing recipes, and so on). The software is stored in a storage medium fixedly provided in the computer, such as a hard disk, or onto/into a storage medium removably set in the computer, such as a CD-ROM, DVD, or flash memory. An example of these storage media is denoted by reference number 201 in FIG. 2. As required, a processor 202 calls, for causing an appropriate program to execute, a predetermined processing recipe from the storage medium 201 in accordance with an instruction or the like sent from a user interface not shown. Thus the functional parts of the liquid processing apparatus 10 operate under the control of the controller 200 and conduct a predetermined process. The controller 200 may be a system controller that controls the entire liquid processing system shown in FIG. 1.

Figure 9:
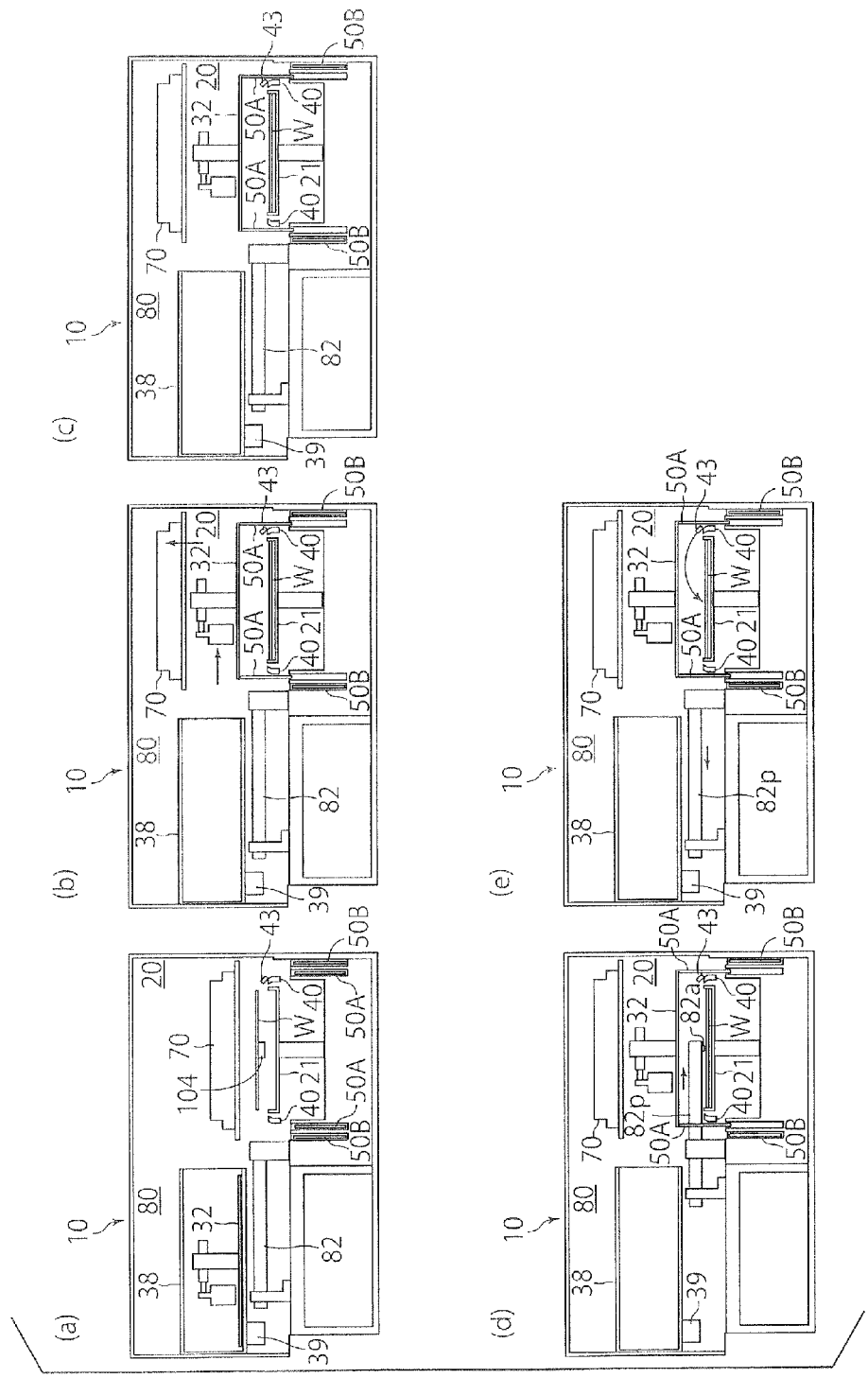
FIG. 9 is an explanatory diagram sequentially showing a part of successive wafer-cleaning steps (a) to (e) conducted by the liquid processing apparatus shown in FIG. 2.
Figure 10:
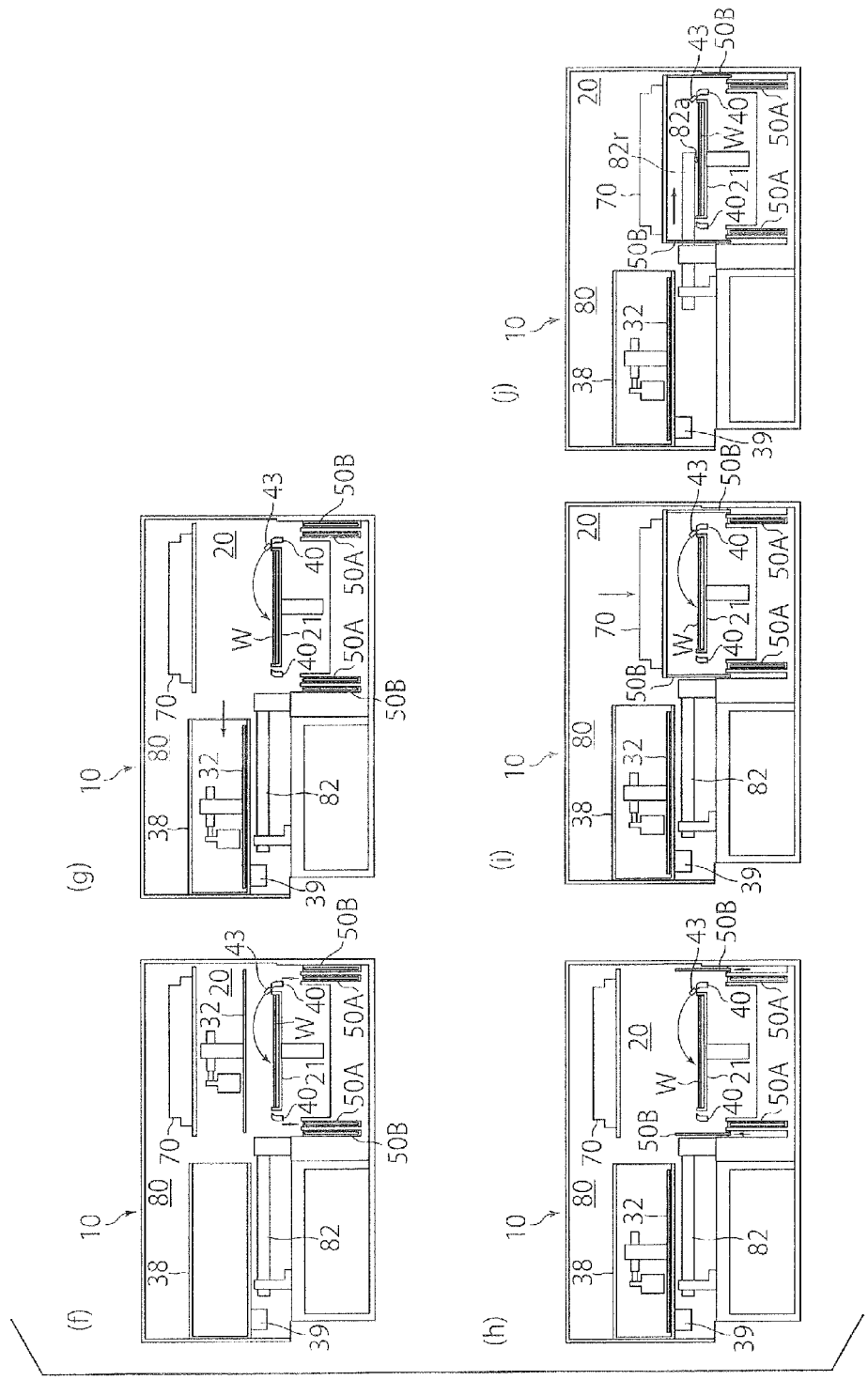
FIG. 10 is an explanatory diagram sequentially showing another part of the successive wafer-cleaning steps (f) to (j) conducted by the liquid processing apparatus shown in FIG. 2.
Figure 11:
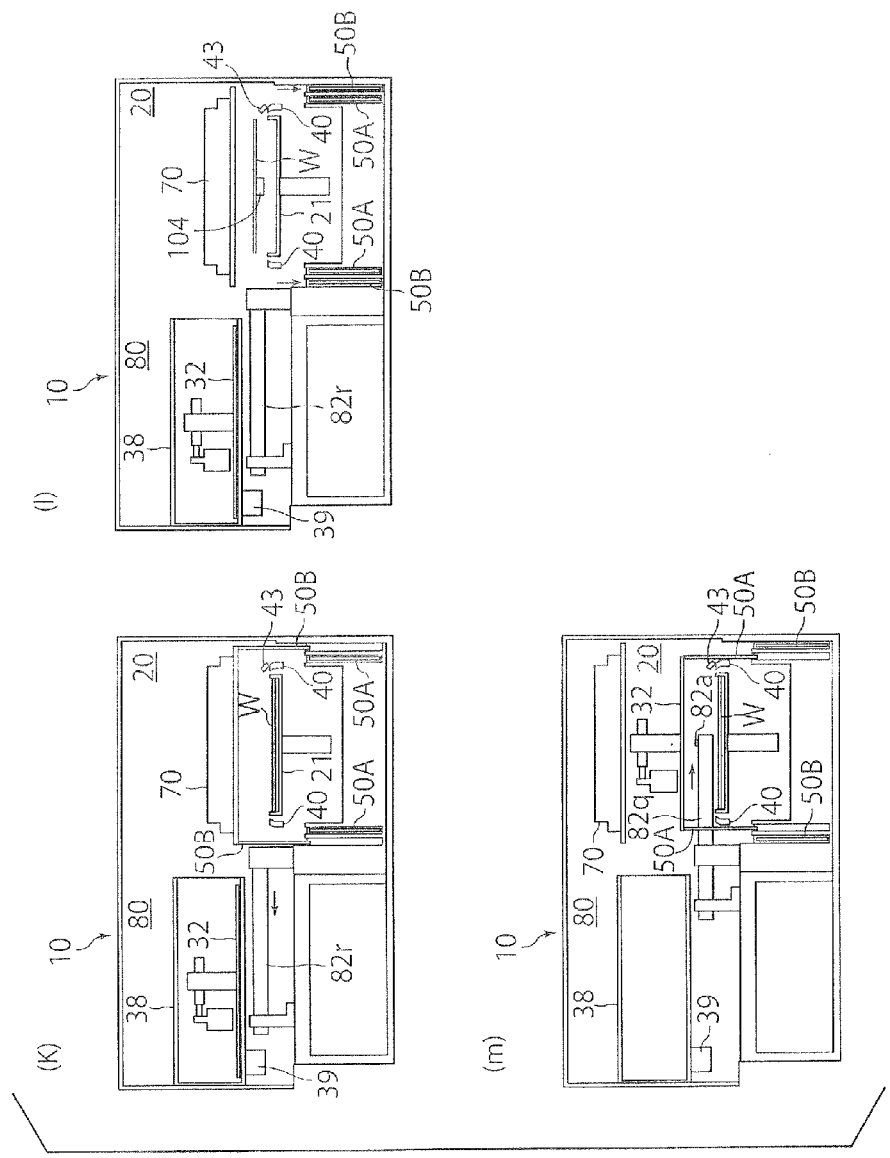
FIG. 11 is an explanatory diagram sequentially showing yet another part of the successive wafer-cleaning steps (k) to (m) conducted by the liquid processing apparatus shown in FIG. 2.

Next, a series of steps constituting a cleaning process conducted using the liquid processing apparatus 10 to remove an unnecessary resist film from the upper surface of the wafer W are described below with reference to FIGS. 9 to 11. The series of cleaning process steps described below are conducted by the controller 200 by controlling the operation of the functional parts of the liquid processing apparatus 10. In FIGS. 9 to 11, constituent elements of the liquid processing apparatus are shown in significantly simplified form with emphasis placed upon clarity of the drawings.

First as shown in (a) of FIG. 9, the top plate 32 is moved to its retreat position and then housed into the top plate storage section 38. The air hood 70 is moved downward from its lifted position shown in FIG. 2, to its lowered position. The inside and outside tubular outer cups 50A and 50B are moved to their respective lowered positions, so that the lateral region of the upper space of the substrate retaining part 21 is cleared. Under the circumstances, the lift pin plate 22 of the substrate retaining part 21 and the processing liquid supply pipe 28 are moved upward from their respective positions shown in FIG. 5, and the shutter 94 in the opening 94a of the process chamber 20 is opened. Next, the wafer W is carried from the outside of the liquid processing apparatus 10 via the opening 94a into the process chamber 20 by the transport arm 104 (see FIG. 1), and then placed on the lift pins 23 of the lift pin plate 22. The transport arm 104 then retreats from the process chamber 20. At this time, each nozzle support arm 82 exists at its retreat position inside the standby region 80. A gas such as clean air is always fed as a downward flow from the air hood 70 into the process chamber 20, thus maintaining the cleanliness of the interior of the process chamber 20.

Next, the lift pin plate 22 and the processing liquid supply pipe 28 are moved downward to their lowered positions as shown in FIG. 5. At this time, the retaining members 25 provided on the retaining plate 26 support the wafer W, placed on the lift pins 23, from lateral directions, so as to slightly remove the wafer W from the lift pins 23.

After that, as shown in (b) of FIG. 9, the air hood 70 is moved from its lowered position to its lifted position and then the top plate 32 is moved from its retreat position to its advance position. The wafer W retained by the substrate retaining part 21 is thus covered with the top plate 32. Next as shown in (c) of FIG. 9, the inside tubular outer cup 50A is moved from is lowered position to its lifted position. Thus, a space isolated from the outside is defined around the wafer W by the top plate 32 and the tubular outer cup 50A. This space is also referred to as the "first processing space" hereinafter. As will be described later, the first processing space is a space where the wafer W is subjected to liquid processing with the SPM liquid obtained by mixing sulfuric acid and a hydrogen peroxide solution. The positional relationship between the upper end of the tubular outer cup 50A, the top plate 32, and their peripheral parts, at this time, is as shown in FIG. 6B. The same also applies in the states shown in (d) to (e) of FIG. 9 and (m) of FIG. 11. When the tubular outer cup 50A is positioned at its lifted position, the lower end of the tubular outer cup 50A is immersed in the cleaning liquid stored within the cleaning tank 52Aa. Thus, a water seal, which breaks communication between the interior space and the exterior space of the tubular outer cup 50A via the space neighboring the lower end of the tubular outer cup 50A, is formed. When the tubular outer cup 50B is positioned at its lifted position, the lower end of the tubular outer cup 50B is likewise immersed in the cleaning liquid stored in the cleaning tank 52Ba, and thus a water seal is formed similarly. Next, the top plate 32 is rotated by the servomotor 36.

Next as shown in (d) of FIG. 9, the first nozzle support arm 82p among the four nozzle support arms 82 standing by in the standby region 80 is advanced into the process chamber 20 through the corresponding side opening 50m of the tubular outer cup 50.

Next, the retaining plate 26 and lift pin plate 22 of the substrate retaining part 21 are rotated to rotate the wafer W retained by the retaining members 25 of the retaining plate 26. The SPM liquid is then supplied, from the nozzle 82a of the first nozzle support arm 82p advanced into the tubular outer cup 50A, to the upper surface of the wafer W, so that an SPM process is performed to the wafer W. By the SPM process, the resist on the surface of the wafer W is peeled off by the SPM liquid. The resist thus peeled off is scattered, together with the SPM liquid, from the wafer W by centrifugal force of the rotating wafer, and is sent to the first draining portion 46a via the guide cup 44 positioned at its lowered position to be collected. During the SPM process, the SPM liquid is preferably emitted uniformly toward the entire region of the wafer W by moving the nozzle 82a of the first nozzle support arm 82p in the leftward and rightward directions of (d) in FIG. 9 while emitting the SPM liquid from the nozzle 82a toward the wafer W.

During the SPM process, since the first processing space formed below the top plate 32 and internally to the tubular outer cup 50A is isolated from the outside, the atmosphere in the first processing space can be prevented from exiting to the outside, and an external atmosphere can be prevented from entering the first processing space. Additionally, since the top plate 32 is rotating on a horizontal plane, droplets of the SPM liquid or any other processing liquid adhering to the lower surface of the top plate 32 flow toward the edge of the top plate 32 by centrifugal force to be flown into the liquid receiving space 132 of the liquid receiving member 130, and then are drained from the liquid receiving space 132 into the factory waste liquid draining line via the drain line 137c on which the drain port 136, the mist separator 137a, and the ejector 137b are arranged. In addition, droplets of the processing liquid adhering to the inner wall surface of the tubular outer cup 50 falls, by the gravity, along the inner wall surface of the tubular outer cup 50A. Re-adhesion of the droplets of the processing liquid such as the SPM liquid to the wafer W is thus suppressed.

After execution of the SPM process for a predetermined time, the emission of the SPM liquid from the nozzle 82a of the first nozzle support arm 82p is finished and then while the wafer W and the top plate 32 are left in the rotating condition, hot deionized water (DIW) heated to 80° C., for example, is supplied from the nozzle 82a' of the first nozzle support arm 82p to conduct high-temperature rinsing process. In this process, the hot deionized water is also supplied from the processing liquid supply pipe 28, toward the lower surface (back surface) of the wafer W, thereby to conduct high-temperature rinsing upon the wafer lower surface as well. During the supply of the hot DIW, the nozzle 82a' may be kept positioned directly above a rotational center of the wafer W or reciprocated in the radial direction of the wafer W. After completion of the SPM emission and before the supply of the hot DIW, the first nozzle support arm 82p may be retreated to be cleaned by the arm cleaning part 88 and then may be advanced into the tubular outer cup 50A again.

After hot rinsing process, as shown in (e) of FIG. 9, the first nozzle support arm 82p retreats from the tubular outer cup 50A and stands by in the standby region 80. In this case, the wafer W and the top plate 32 further continue to rotate. When the first nozzle support arm 82p retreats from the inner region of the tubular outer cup 50 and moves to its retreat position, the first nozzle support arm 82p is cleaned by the arm cleaning part 88, whereby contaminants derived from the SPM process adhering to the first nozzle support arm 82p are removed. Immediately after the hot rinsing process, deionized water (e.g., 80° C.) is also supplied from the fixed rinsing nozzle 43, toward the central portion of the wafer W. Since a liquid film of the deionized water is formed on the surface of the wafer W by supplying the deionized water from the fixed rinsing nozzle 43 to the rotating wafer W, the surface of the wafer W will not be exposed to the atmosphere and thus adhesion of particles to the surface of the wafer W can be prevented.

Next, the top plate 32 stops rotating, and as shown in (f) of FIG. 10, the tubular outer cup 50A moves downward to its lowered position and becomes immersed in the cleaning liquid (deionized water) stored within the cleaning tank 52Aa. Thus, any SPM-derived contaminants adhering to the inner surface of the tubular outer cup 50A during the SPM process are removed by the cleaning liquid in the cleaning tank 52Aa. The tubular outer cup 50A stands by inside the cleaning tank 52Aa until it is used next time.

Next as shown in (g) of FIG. 10, the top plate 32 is moved from its advance position to its retreat position and stored into the top plate storage section 38. Although at this time the SPM-derived contamination (such as a condensate of fumes) adheres to the lower surface of the top plate 32, since the interior of the top plate storage section 38 is exhausted by the exhaust portion 39, an atmosphere containing contaminants does not flow out into the standby region 80 or to the inside of the process chamber 20.

Next as shown in (h) of FIG. 10, the outside tubular outer cup 50B is moved upward to its lifted position by the driving mechanism 54B. After this, as shown in (i) of FIG. 10, the air hood 70 moves downward from its lifted position to its lowered position. At this time, the upper end of the tubular outer cup 50 come into contact with or close proximity to the lower surface of the bottom plate 77 of the air hood 70. Thus, a second processing space isolated from the outside by the air hood 70 and the tubular outer cup 50B will be formed around the wafer W. A gas (clean air) that has been cleaned by the air hood 70 is supplied into the second processing space to replace an atmosphere left therein.

Next, the supply of the rinsing liquid from the fixed rinsing nozzle 43 is stopped and as shown in (j) of FIG. 10, the third nozzle support arm 82r standing by in the standby region 80 advances to the inner region of the tubular outer cup 50B via the side opening 50m of the tubular outer cup 50B. After this, while the wafer W further remains in the rotating condition and the cleaned gas from the air hood 70 is flowing within the second processing space, the SC-1 liquid is supplied from the nozzle 82a of the third nozzle support arm 82r having advanced to the inner region of the tubular outer cup 50B, toward the central portion of the wafer W. This enables removal of a resist residue left on the surface of the wafer W. When the SC-1 process liquid is performed to the wafer W, the SC-1 liquid and the resist residue are sent to the second draining portion 46b via the guide cup 44 positioned at its lifted position and drained therefrom.

Since the second processing space formed internally to the air hood 70 and to the outside tubular outer cup 50B is isolated from the outside during liquid processing of the wafer W with the SC-1 liquid, an atmosphere containing components of the SC-1 liquid can be prevented from exiting to the outside, and an external atmosphere can be prevented from entering the second processing space. In addition, since the second processing space is a closed space, cleanliness of the second processing space can be maintained by the cleaned gas.

Upon completion of the SC-1 process, as shown in (k) of FIG. 11, the third nozzle support arm 82r retreats from the inner region of the tubular outer cup 50B and stands by in the standby region 80. The wafer W continues to rotate at this time. Additionally, when the third nozzle support arm 82r retreats from the inner region of the tubular outer cup 50B and moves to its retreat position, the third nozzle support arm 82r is cleaned by the arm cleaning part 88. The SC-1 liquid and other contaminants adhering to the third nozzle support arm 82r are thus removed. The cleaned gas from the air hood 70 continues to flow inside of the second processing space, even after the third nozzle support arm 82r is retreated from the inner region of the tubular outer cup 50B. Next, the third nozzle support arm 82r advances to the inner region of the tubular outer cup 50B via the side opening 50m of the tubular outer cup 50B, that is, returns to the state shown in (j) of FIG. 10. While the wafer W further remains in the rotating condition, normal-temperature deionized water is supplied from the nozzle 82a of the third nozzle support arm 82r toward the central portion of the wafer W. At this time, the normal-temperature deionized water is also supplied from the processing liquid supply pipe 28 toward the lower surface (back surface) of the wafer W. Thus, the rinsing process is performed to the wafer W. After this, the wafer W is rotated at a high speed and dried in the second processing space.

After the liquid process to the wafer W with the SC-1 liquid finishes and the third nozzle support arm 82r retreats from the inner region of the tubular outer cup 50B and before performing the wafer drying process, a rinsing process to the wafer W may be performed by advancing the fourth nozzle support arm 82s to the inner region of the tubular outer cup 50B and spraying deionized water droplets onto the wafer W from the two-fluid nozzle of the fourth nozzle support arm 82s. In this case, even after the rinsing process to the wafer W finishes and the fourth nozzle support arm 82s retreats from the inner region of the tubular outer cup 50, the cleaned gas from the air hood 70 continues to flow inside the second processing space. After this, the wafer W is rotated at a high speed and dried in the second processing space.

After the wafer drying process finishes, as shown in (l) of FIG. 11, the outside tubular outer cup 50B moves downward from its lifted position to its lowered position, so that the lateral region of the upper space of the substrate retaining part 21 is cleared. After this, the lift pin plate 22 of the substrate retaining part 21 and the processing liquid supply pipe 28 are moved upward from their respective positions shown in FIG. 5, and the shutter 94 provided at the opening 94a of the process chamber 20 is opened. Next, the transport arm 104 enters the process chamber 20 from the outside of the liquid processing apparatus 10 via the opening 94a, and the wafer W on the lift pins 23 of the lift pin plate 22 is transferred to the transport arm 104. Next, the wafer W is removed by the transport arm 104 and then carried out from the liquid processing apparatus 10. Thus, a series of liquid processing of the wafer W is completed.

Next, the cleaning of the top plate 32 is described below referring to (m) of FIG. 11. Before the top plate 32 is cleaned, the air hood 70 is moved from its lowered position to its lifted position and then the top plate 32 is moved from its retreat position to its advance position. In addition, after the top plate 32 is moved to its advance position, the inside tubular outer cup 50A is moved upward from its lowered position to occupy its lifted position, and rotational driving force is next imparted to the top plate 32 by means of the servomotor 36 to rotate the top plate 32 about the rotating shaft 34, along a horizontal plane.

After the tubular outer cup 50A moves to its lifted position, only the second nozzle support arm 82q of the four nozzle support arms 82 advances to the inner region of the tubular outer cup 50A via the side opening 50m of the tubular outer cup 50A.

After that, while the top plate 32 is rotating, a top-plate cleaning liquid such as deionized water is emitted toward the top plate 32 from the nozzle 82a of the nozzle support arm 82q having advanced to the inner region of the tubular outer cup 50. Hence, SPM-derived contaminants adhering to the top plate 32, such as a condensate of fumes, are removed. At this phase, the top plate 32 can be cleaned uniformly over its entire region by moving the nozzle 82a of the second nozzle support arm 82q in the leftward and rightward directions of (m) in FIG. 11 while emitting the top-plate cleaning liquid, such as deionized water, from the nozzle 82a toward the top plate 32. In addition, when the top plate 32 is cleaned, since the closed space is formed internally to the top plate 32 and to the tubular outer cup 50, the top-plate cleaning liquid emitted from the nozzle 82a of the second nozzle support arm 82q can be prevented from going out of the inner region of the tubular outer cup 50. Furthermore, during the cleaning of the top plate 32, like during the SPM process of the wafer W, the cleaning liquid adhering to the lower surface of the top plate 32 first flows toward the peripheral edge thereof by centrifugal force and then flows into the liquid receiving space 132 of the liquid receiving member 130. The cleaning liquid is then drained from the liquid receiving space 132 into the factory waste liquid draining system via the drain line 137c on which the drain port 136, the mist separator 137a, and the ejector 137b are arranged. Moreover, droplets of the cleaning liquid adhering to the inner wall of the tubular outer cup 50 fall along the inner wall surface of the tubular outer cup 50 by gravity.

The above-described cleaning process of the top plate 32 may be performed every time after the resist film removing process and the cleaning process of the wafer are completed, or may be performed at regular time intervals. The cleaning process of the top plate 32 can also be conducted concurrently with the hot rinsing process of the wafer W. For simultaneous execution of the top plate cleaning process and wafer hot rinsing process, the first nozzle support arm 82p and the second nozzle support arm 82q advance into the tubular outer cup 50 at the same time. The second nozzle support arm 82q at this time is higher than the first nozzle support arm 82p in height level. This prevents the first nozzle support arm 82p and the second nozzle support arm 82q from colliding or interfering with each other when both of the arms advance to the internal space of the tubular outer cup 50 at the same time. This in turn enables the simultaneous execution of top plate cleaning process by the nozzle 82a of the second nozzle support arm 82q and the wafer hot rinsing process by the nozzle 82a of the first nozzle support arm 82p.

In the above embodiment, the tubular outer cups 50A, 50B are disposed around the rotary cup 40 which receives the processing liquid scattering from the wafer W, the drain cup 42, and the guide cup 44, and during the liquid process, the tubular outer cup 50A or 50E3 is positioned to its lifted position at which the upper end of the cup is positioned above the rotary cup 40. Accordingly, the mist or fumes derived from the processing liquid that spread from the upper opening in the rotary cup 40 are prevented from spreading over a wide range (especially, radially outward direction of the wafer in a plan view) in the processing apparatus. In addition, the two tubular outer cups 50A and 50B are used in first chemical liquid process and second chemical liquid process, respectively. Thus, the mist or fumes derived from the processing liquid that adhere to either tubular outer cup (e.g., 50A) can be prevented from contaminating the processing space formed by the other tubular outer cup (e.g., 50B), that is, cross contamination via the tubular outer cups 50A and 50B can be prevented.

In addition, in the above embodiment, when liquid processing is conducted using the first chemical liquid (SPM liquid) that is highly contaminative, the first processing space is formed using the inside tubular outer cup 50A, and when liquid processing is conducted using the second chemical liquid (in the present example, the SC-1 liquid) that is less contaminative than that of the SPM liquid, the second processing space is formed using the outside tubular outer cup 50B. When not used, the inside tubular outer cup 50A is immersed in the cleaning liquid stored within the cleaning tank 52Aa. For this reason, during liquid process using the SPM liquid, the inside tubular outer cup 50A prevents the internal atmosphere thereof from spreading to the outside, and thus does not contaminate the outside tubular outer cup 50B. At this time, since the tubular outer cup 50B is immersed in the cleaning liquid stored within the cleaning tank 52Ba, contamination of the tubular outer cup 50B is prevented more reliably. After the liquid process with the SPM liquid, therefore, the liquid process with the SC-1 liquid can be immediately conducted by lifting the tubular outer cup 50B. In addition, during the process with the SC-1 liquid, the inside tubular outer cup 50A is immersed in the cleaning liquid stored within the cleaning tank 52Aa, this cup is kept free from an influence of the atmosphere of the second processing space formed internally to the outside tubular outer cup 50B, and thus does not become contaminated by the SC-1 liquid. During the liquid process with the SC-1 liquid, although a mist of the SC-1 liquid is likely to fall on a fluid surface of the cleaning liquid within the cleaning tank 52Aa. However, since the SC-1 process is a low contaminative process because of no fuming and a new cleaning liquid is always supplied to the cleaning tank 52Aa, contamination of the inside tubular outer cup 50A substantially is not problematic. As will be understandable from the above, the inside tubular outer cup 50A is preferably used for a liquid process using a chemical liquid that has a relatively high contaminative potential, whereas the outside tubular outer cup 50B is preferably used for a liquid process using a chemical liquid that has a relatively low contaminative potential.

Furthermore, in the above embodiment, the nozzle support arm 82 that retains the nozzle at its distal end is adapted to move straight ahead through the side opening 50m formed in the side portion of the tubular outer cup 50A or 50B, and advance into the tubular outer cup. This prevents the chemical liquid atmosphere from spreading outward in the radial direction of the wafer W from the space above the wafer when the chemical liquid is supplied from the nozzle 82*a* to the wafer, or significantly suppresses such a spread. Besides, in the above embodiment, since the upper opening 50*n* of the tubular outer cups 50A, 50B is blocked with the top plate 32 or the air hood 70, the chemical liquid atmosphere is prevented from spreading further upward from the space above the wafer, or such a spread is significantly suppressed.

Various modifications may be applied to the above embodiment as described below.

The flow rectifying plate 140 and liquid receiving member 130 provided together with the top plate 32 are preferably provided, but may be omitted. In this latter case, the top plate 32 may have an outside diameter slightly smaller than a diameter of the inner wall of the inside tubular outer cup 50A, and may be positioned internally to the upper end portion of the tubular outer cup 50A positioned at its lifted position. Thus, the chemical liquid (or a condensate of fumes) scattered from the lower surface of the rotating top plate 32 by centrifugal force collides against the inner wall surface of the tubular outer cup 50A, flows downward by gravity, and is finally mixed with the cleaning liquid in the cleaning tank 52Ab to be drained with a flow of the cleaning liquid.

One nozzle arm may include two (or more) nozzles that each supply one of two (or more) different chemical liquids. To be more specific, one nozzle arm may include a nozzle for supplying SPM liquid, and a nozzle for supplying an SC-1 liquid. In this case, once the SPM process is completed, the nozzle arm is desirably cleaned before the SC-1 liquid process is started.

Although the SPM process and the SC-1 liquid process are performed as chemical liquid processes in the above embodiment, the chemical liquid processes are not limited thereto. The two kinds of liquid process executed inside the two tubular outer cups may be any chemical liquid processes in which cross contamination may be problematic. In addition, one of the two kinds of liquid processing executed inside the two tubular outer cups may be a chemical liquid process and the other may be a rinsing process (deionized water rinsing).

The invention claimed is:

1. A liquid processing apparatus comprising:
    a substrate retaining part that retains a substrate in a horizontal position and rotates the substrate;
    a first processing liquid supply nozzle that supplies a first processing liquid to the substrate retained by the substrate retaining part;
    a second processing liquid supply nozzle that supplies a second processing liquid to the substrate retained by the substrate retaining part;
    a liquid receiving cup disposed to surround the substrate retained by the substrate retaining part in radial directions of the substrate such that an upper end of the liquid receiving cup is positioned above the substrate, so as to receive the processing liquid having been supplied from the first processing liquid supply nozzle or the second processing liquid supply nozzle to the substrate;
    a first tubular outer cup including an upper opening and disposed around the liquid receiving cup, the first tubular outer cup being vertically movable between a lifted position at which an upper end of the first tubular outer cup is positioned above the liquid receiving cup, and a lowered position positioned lower than the lifted position; and
    a second tubular outer cup including an upper opening and disposed around the liquid receiving cup and outside the first tubular outer cup, the second tubular outer cup being vertically movable between a lifted position at which an upper end of the second tubular outer cup is positioned above the liquid receiving cup, and a lowered position positioned lower than the lifted position;
    when the first processing liquid supply nozzle supplies the first processing liquid to the substrate, the first tubular outer cup is positioned at its lifted position and the second tubular outer cup is positioned at its lowered position; and
    when the second processing liquid supply nozzle supplies the second processing liquid to the substrate, the first tubular outer cup is positioned at its lowered position and the second tubular outer cup is positioned at its lifted position.

2. The liquid processing apparatus according to claim 1, further comprising:
    a first nozzle arm that retains at its distal end portion the first processing liquid supply nozzle;
    a first arm driving mechanism that moves the first nozzle arm linearly in a longitudinal direction of the first nozzle arm;
    a second nozzle arm that retains at its distal end portion the second processing liquid supply nozzle; and
    a second arm driving mechanism that moves the second nozzle arm linearly in a longitudinal direction of the second nozzle arm;
    wherein:
    a first side opening is provided in a side portion of the first tubular outer cup to allow the distal end of the first nozzle arm to advance therethrough into an inside of the first tubular outer cup positioned at the lifted position by moving the first nozzle arm linearly by the first arm driving mechanism; and
    a second side opening is provided in a side portion of the second tubular outer cup to allow the distal end of the second nozzle arm to advance therethrough into an inside of the second tubular outer cup positioned at the lifted position by moving the second nozzle arm linearly by the second arm driving mechanism.

3. The liquid processing apparatus according to claim 1, further comprising a first cleaning bath for storing a cleaning liquid, the first cleaning bath being disposed such that the first tubular outer cup is immersed in the cleaning liquid stored in the first cleaning bath when the first tubular outer cup is located at its lowered position.

4. The liquid processing apparatus according to claim 3, further comprising a second cleaning bath for storing a cleaning liquid, the second cleaning bath being disposed such that the second tubular outer cup is immersed in the cleaning liquid stored in the second cleaning bath when the second tubular outer cup is located at its lowered position.

5. The liquid processing apparatus according to claim 1, further comprising a top plate that covers from above the substrate retained by the substrate retaining part, wherein the top plate blocks the upper opening of the first tubular outer cup positioned at its lifted position to define a first processing space inside the first tubular outer cup and below the top plate.

6. The liquid processing apparatus according to claim 5, further comprising an air hood that covers from above the substrate retained by the substrate retaining part, wherein the air hood blocks the upper opening of the second tubular outer cup positioned at its lifted position and defines a second processing space, inside the second tubular outer cup and below the top plate, into which a cleaned gas flows.

7. The liquid processing apparatus according to claim 1, wherein the liquid receiving cup comprises a drain cup provided at a fixed position and a guide cup provided inside the drain cup so as to move vertically, wherein the first processing liquid and second processing liquid that have been used for processing can be guided to different draining portions by vertically moving the guide cup.

8. A liquid processing method that uses a liquid processing apparatus which includes:
- a substrate retaining part that retains a substrate in a horizontal position and rotates the substrate;
- a first processing liquid supply nozzle that supplies a first processing liquid to the substrate retained by the substrate retaining part;
- a second processing liquid supply nozzle that supplies a second processing liquid to the substrate retained by the substrate retaining part;
- a liquid receiving cup disposed to surround the substrate retained by the substrate retaining part in radial directions of the substrate such that an upper end of the liquid receiving cup is positioned above the substrate, so as to receive the processing liquid having been supplied from the first processing liquid supply nozzle or the second processing liquid supply nozzle to the substrate;
- a first tubular outer cup including an upper opening and disposed around the liquid receiving cup, the first tubular outer cup being vertically movable between a lifted position at which an upper end of the first tubular outer cup is positioned above the liquid receiving cup, and a lowered position positioned lower than the lifted position; and
- a second tubular outer cup including an upper opening and disposed around the liquid receiving cup and outside the first tubular outer cup, the second tubular outer cup being vertically movable between a lifted position at which an upper end of the second tubular outer cup is positioned above the liquid receiving cup, and a lowered position positioned lower than the lifted position, said liquid processing method comprising:
- a first liquid processing step of processing the substrate with the first processing liquid by supplying the first processing liquid from the first nozzle to the substrate while rotating the substrate retained by the substrate retaining part with the first tubular outer cup located at its lifted position and the second tubular outer cup located at its lowered position; and
- a second liquid processing step of processing the substrate with the second processing liquid by supplying the second processing liquid from the second nozzle to the substrate while rotating the substrate retained by the substrate retaining part with the second tubular outer cup located at its lifted position and the first tubular outer cup located at its lowered position.

9. The liquid processing method according to claim 8, further comprising:
- when executing the first liquid processing step, advancing a distal end side of a first nozzle arm which retains the first processing liquid supply nozzle at a distal end portion thereof into an inside of the first tubular outer cup through a first side opening provided in a side portion of the first tubular cup; and
- when executing the second liquid processing step, advancing a distal end side of a second nozzle arm which retains the second processing liquid supply nozzle at a distal end portion thereof into an inside of the second tubular outer cup through a second side opening provided in a side portion of the second tubular cup.

10. The liquid processing method according to claim 9, wherein the first tubular cup, when positioned at its lowered position, is immersed in a cleaning liquid stored in a first cleaning bath, and the second tubular cup, when positioned at its lowered position, is immersed in a cleaning liquid stored in a second cleaning bath.

11. The liquid processing method according to claim 9, wherein:
- when the first liquid processing step is performed, a top plate blocks the upper opening of the first tubular outer cup positioned at its lifted position so as to cover the substrate from above and define a first processing space inside the first tubular outer cup and below the top plate; and
- when the second liquid processing step is performed, an air hood blocks the upper opening of the second tubular outer cup positioned at its lifted position so as to cover the substrate from above and define a second processing space inside the second tubular outer cup and below the air hood, and the air hood creates a downward flow of a cleaned gas in the second processing space.

12. The liquid processing method according to claim 9, wherein:
- the liquid receiving cup includes a movable portion capable of moving vertically, and when a process is performed with the first processing liquid and when a process is performed with the second processing liquid, the movable portion is positioned at different heights to guide the first processing liquid and the second processing liquid that have been used for the processes to different draining portions.

13. The liquid processing method according to claim 8, wherein:
- when the first liquid processing step is performed, a top plate blocks the upper opening of the first tubular outer cup positioned at its lifted position so as to cover the substrate from above and define a first processing space inside the first tubular outer cup and below the top plate; and
- when the second liquid processing step is performed, an air hood blocks the upper opening of the second tubular outer cup positioned at its lifted position so as to cover the substrate from above and define a second processing space inside the second tubular outer cup and below the air hood, and the air hood creates a downward flow of a cleaned gas in the second processing space.

14. The liquid processing method according to claim 8, wherein:
- the liquid receiving cup includes a movable portion capable of moving vertically, and when a process is performed with the first processing liquid and when a process is performed with the second processing liquid, the movable portion is positioned at different heights to guide the first processing liquid and the second processing liquid that have been used for the processes to different draining portions.

\* \* \* \* \*